US011670627B1

United States Patent
Alapati et al.

(10) Patent No.: US 11,670,627 B1
(45) Date of Patent: *Jun. 6, 2023

(54) HYBRID SYSTEM INCLUDING PHOTONIC AND ELECTRONIC INTEGRATED CIRCUITS AND COOLING PLATE

(71) Applicant: Psiquantum, Corp., Palo Alto, CA (US)

(72) Inventors: Ramakanth Alapati, Dublin, CA (US); Gabriel J. Mendoza, San Francisco, CA (US)

(73) Assignee: Psiquantum, Corp., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/384,610

(22) Filed: Jul. 23, 2021

Related U.S. Application Data

(63) Continuation of application No. 16/724,135, filed on Dec. 20, 2019, now Pat. No. 11,107,799.

(Continued)

(51) Int. Cl.
*H01L 31/0232* (2014.01)
*H01L 25/16* (2023.01)
(Continued)

(52) U.S. Cl.
CPC .......... *H01L 25/167* (2013.01); *G02B 6/3636* (2013.01); *H01L 21/486* (2013.01);
(Continued)

(58) Field of Classification Search
CPC combination set(s) only.
See application file for complete search history.

(56) References Cited

U.S. PATENT DOCUMENTS

2011/0205708 A1* 8/2011 Andry ............... H01L 23/3677
438/122
2012/0301149 A1* 11/2012 Pinguet ............... G02B 6/4295
398/115

(Continued)

FOREIGN PATENT DOCUMENTS

WO    WO-2018178745 A1 * 10/2018 ......... G02B 6/12002

OTHER PUBLICATIONS

U.S. Appl. No. 16/724,135, "Notice of Allowance", dated Apr. 27, 2021, 10 pages.

*Primary Examiner* — Niki H Nguyen
(74) *Attorney, Agent, or Firm* — Kilpatrick Townsend & Townsend LLP

(57) ABSTRACT

Techniques disclosed herein relate generally to integrating photonic integrated circuits and electronic integrated circuits in a same package. A device includes a semiconductor substrate and a die stack on the semiconductor substrate. The die stack includes a photonic integrated circuit (PIC) die and an electronic integrated circuit (EIC) die. The PIC die includes a PIC substrate and a photonic integrated circuit formed on the PIC substrate. The EIC die includes an EIC substrate and an electronic integrated circuit formed on the EIC substrate. The EIC die and the PIC die are bonded such that the PIC substrate and the EIC substrate are disposed on opposing sides of the die stack. The PIC substrate is bonded to the semiconductor substrate. The device also includes a cooling plate bonded to the EIC substrate.

18 Claims, 21 Drawing Sheets

Related U.S. Application Data

(60) Provisional application No. 62/784,284, filed on Dec. 21, 2018.

(51) Int. Cl.

| | | |
|---|---|---|
| *H01L 23/498* | (2006.01) | |
| *H01L 23/00* | (2006.01) | |
| *G02B 6/36* | (2006.01) | |
| *H01L 21/48* | (2006.01) | |
| *H01L 23/48* | (2006.01) | |
| *H01L 23/367* | (2006.01) | |

(52) U.S. Cl.
CPC ...... *H01L 21/4853* (2013.01); *H01L 21/4882* (2013.01); *H01L 23/3672* (2013.01); *H01L 23/481* (2013.01); *H01L 23/49827* (2013.01); *H01L 24/08* (2013.01); *H01L 24/48* (2013.01); *H01L 24/80* (2013.01); *H01L 24/85* (2013.01); *H01L 2224/08145* (2013.01); *H01L 2224/48157* (2013.01); *H01L 2224/80895* (2013.01); *H01L 2224/80896* (2013.01); *H01L 2924/12043* (2013.01); *H01L 2924/1431* (2013.01); *H01L 2924/1903* (2013.01); *H01L 2924/19041* (2013.01); *H01L 2924/19107* (2013.01)

(56) References Cited

U.S. PATENT DOCUMENTS

| | | | |
|---|---|---|---|
| 2015/0125111 A1* | 5/2015 | Orcutt | G02B 6/122 438/701 |
| 2020/0013699 A1 | 1/2020 | Liu et al. | |

* cited by examiner

HYBRID SYSTEM INCLUDING PHOTONIC AND ELECTRONIC INTEGRATED CIRCUITS AND COOLING PLATE

CROSS-REFERENCE TO RELATED APPLICATION

This patent application is a continuation of U.S. patent application Ser. No. 16/724,135, filed Dec. 20, 2019; which claims benefits of and priority to U.S. Provisional Patent Application No. 62/784,284, filed Dec. 21, 2018, the disclosure of which are hereby incorporated by reference in their entirety for all purposes.

BACKGROUND

Photonic integrated circuits, such as silicon photonic integrated circuits, can be used in many systems, such as communication systems and optical quantum computing systems, which may also include many electronic integrated circuits. The electronic integrated circuits may be used to control the operations of the photonic integrated circuits, or to provide inputs to and/or process outputs from the photonic integrated circuits. In many high performance systems, the package of the photonic integrated circuits and/or the electronic integrated circuits may significantly affect the performance of the systems.

SUMMARY

Techniques disclosed herein relate generally to integrating photonic integrated circuits and electronic integrated circuits in a hybrid system. In one embodiment, photonic integrated circuits and electronic integrated circuits are assembled in a same package, which may also include optical and electrical cables, such as optical fibers and electrical ribbon cables. In some embodiments, the interconnection paths between the photonic integrated circuits and electronic integrated circuits are minimized through face-to-face bonding for improved performance. The packaged system may also include cooling mechanisms (e.g., one or more cooling plates) to keep at least some parts of the hybrid system at cryogenic temperatures for optimum performance. Various inventive embodiments are described herein, including methods, processes, systems, devices, and the like.

In accordance with an example implementation, a device may include a semiconductor substrate and a die stack on the semiconductor substrate. The die stack may include a photonic integrated circuit (PIC) die including a PIC substrate and a photonic integrated circuit formed on the PIC substrate, and an electronic integrated circuit (EIC) die including an EIC substrate and an electronic integrated circuit formed on the EIC substrate. The EIC die and the PIC die may be bonded such that the PIC substrate and the EIC substrate are disposed on opposing sides of the die stack. The PIC substrate may be bonded to the semiconductor substrate. The device may also include a cooling plate bonded to the EIC substrate.

In some embodiments of the device, the cooling plate may include a second semiconductor substrate or a metal plate. In some embodiments, the cooling plate may include a mesa structure, and the EIC substrate may be bonded to the mesa structure of the cooling plate. In some embodiments, the mesa structure may include a metal layer, and the EIC substrate may be bonded to the metal layer of the mesa structure.

In some embodiments, the device may also include a printed circuit board (PCB) on the semiconductor substrate, where the PCB may be electrically coupled to the die stack. In some embodiments, the device may also include a glass substrate including through-glass vias (TGVs), where the glass substrate may be bonded to the PIC die, the PCB may be electrically coupled to the die stack through the TGVs, and the TGVs may be connected to the PCB through one or more bonding wires. In some embodiments, a bonding wire of the one or more bonding wires may be connected to the die stack through two or more TGVs in the glass substrate. In some embodiments, the EIC die may include bonding pads on a surface of the EIC die opposite to a bonding interface between the EIC die and the PIC die, and the PCB may be electrically coupled to the bonding pads through bonding wires. In some embodiments, the EIC die may include one or more through-silicon vias (TSVs) that connect the bonding pads to the electronic integrated circuit.

In some embodiments, the die stack may be bonded to the semiconductor substrate through fusion bonding. In some embodiments, the EIC die and the PIC die may be bonded using fusion bonding or hybrid bonding. In some embodiments, the device may also include an optical fiber coupled to the photonic integrated circuit. In some embodiments, the device may also include a second die stack on the semiconductor substrate.

In accordance with an example implementation, a method may include fusion-bonding a die stack to a semiconductor substrate, bonding a printed circuit board (PCB) on the semiconductor substrate, wire-bonding solder pads on the PCB to the die stack, and bonding a cooling plate to the EIC substrate. The die stack may include a photonic integrated circuit (PIC) die and an electronic integrated circuit (EIC) die. The PIC die may include a PIC substrate and a photonic integrated circuit formed on the PIC substrate. The EIC die may include an EIC substrate and an electronic integrated circuit formed on the EIC substrate. The PIC substrate may be bonded to the semiconductor substrate.

In some embodiments of the method, the EIC die and the PIC die may be bonded using fusion bonding or hybrid bonding such that the PIC substrate and the EIC substrate are disposed on opposing sides of the die stack. In some embodiments, the cooling plate may include a second semiconductor substrate or a metal plate.

In some embodiments, the method may also include fabricating a mesa structure on the cooling plate, and coating the mesa structure with a metal layer, where bonding the cooling plate to the EIC substrate may include bonding the EIC substrate to the metal layer on the mesa structure. In some embodiments, fabricating the mesa structure on the cooling plate may include micro-machining the cooling plate to form the mesa structure on the cooling plate. In some embodiments, coating the mesa structure with the metal layer may include 3-D printing the metal layer on the mesa structure. In some embodiments, the metal layer may include a gold layer.

In some embodiments, the method may also include fabricating a mesa structure on the cooling plate, and coating the mesa structure with an epoxy layer, where bonding the cooling plate to the EIC substrate may include bonding the EIC substrate to the epoxy layer on the mesa structure. In some embodiments, the method may also include coupling an optical fiber to the PIC on the PIC die. In some embodiments, the method may also include bonding a glass substrate to the PIC die, where the glass substrate may include through-glass vias (TGVs), and wire-bonding the solder pads on the PCB to the die stack may include wire-bonding the solder pads on the PCB to the die stack through the TGVs.

In accordance with another example implementation, a device may include a cooling plate and a die stack on the cooling plate. The die stack may include a photonic integrated circuit (PIC) die and an electronic integrated circuit (EIC) die. The PIC die may include a PIC substrate and a photonic integrated circuit formed on the PIC substrate. The EIC die may include an EIC substrate and an electronic integrated circuit formed on the EIC substrate. The EIC die and the PIC die may be bonded such that the PIC substrate and the EIC substrate are disposed on opposing sides of the die stack. The EIC substrate may be bonded to the cooling plate.

In some embodiments of the device, the cooling plate may include a mesa structure, and the EIC substrate may be bonded to the mesa structure of the cooling plate. In some embodiments, the cooling plate may include a semiconductor substrate. In some embodiments, the cooling plate may include a metal plate. In some embodiments, the device may include a printed circuit board (PCB) on the cooling plate, where the PIC die may include through-silicon vias (TSVs), and the PCB may be connected to the photonic integrated circuit and the electronic integrated circuit through bonding wires and the TSVs.

Numerous benefits can be achieved by way of the present invention over conventional techniques. For example, techniques disclosed herein can be used to fabricate devices including one or more photonic integrated circuits, one or more electronic integrated circuits, and optical fibers in a single package with improved thermal and electrical performance. The techniques disclosed herein can reduce or minimize the thermal resistance at interfaces between components, improve overall thermal conductivity, minimize thermal gradient, and match coefficients of thermal expansion (CTEs), such that the package can allow the photonic circuits and electronic circuits to operate at cryogenic temperatures, such as below 10 K or below 5 K. In addition, face-to-face bonding of the photonic integrated circuits and the electronic integrated circuits may reduce the delay and signal attenuation between the photonic integrated circuits and the electronic integrated circuits, and thus can improve the speed and power efficiency of the device.

BRIEF DESCRIPTION OF THE DRAWINGS

Aspects of the present disclosure are illustrated by way of example. Non-limiting and non-exhaustive aspects are described with reference to the following figures, wherein like reference numerals refer to like parts throughout the various figures unless otherwise specified.

DETAILED DESCRIPTION

Figure 1:
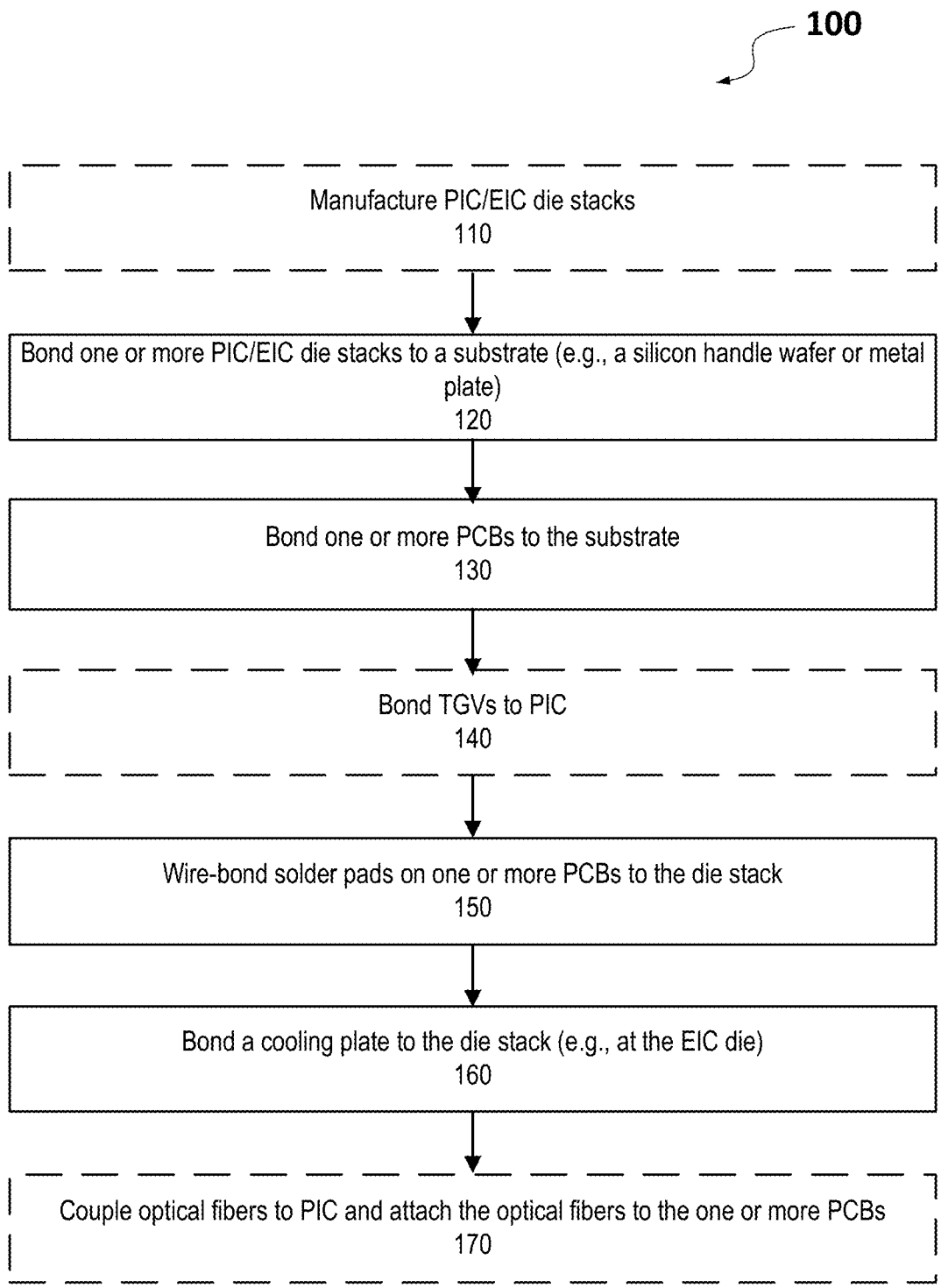
FIG. 1 is a flow chart illustrating an example of a process for integrating photonic integrated circuits and electronic integrated circuits in a single package according to certain embodiments.

Techniques disclosed herein relate generally to assembling a device that includes both photonic integrated circuits (PICs) and electronic integrated circuits (EICs) in a single package. The PICs may include, for example, a quantum computing die, and the EICs may include, for example, a controller die. The electrical performance of the package enables the device to function at a high speed (e.g., 5 GHz or higher). The thermal performance of the package allows the device to function at cryogenic temperatures (e.g., below 20 K, below 15 K, below 10 K, or below 5 K). Various inventive embodiments are described herein, including methods, processes, systems, devices, and the like.

According to certain embodiments, one or more die stacks each including an EIC die and a PIC die bonded face-to-face may be fusion-bonded to a substrate (e.g., a silicon substrate or a metal plate). One or more printed circuit boards (PCBs) may also be physically bonded on the substrate and wire-bonded to the one or more die stacks. The PCBs may include organic materials, passive semiconductor (e.g., silicon) interposers, active semiconductor (e.g., silicon) interposers, or other interposers. The one or more PCBs may be electrically connected to the PICs and EICs by bonding wires, through-silicon vias (TSVs), through-glass vias (TGVs), or any combination thereof. In some embodiments, optical fibers may be coupled to the PICs, for example, using V-grooves formed on the PIC dies. Cooling plates may be attached to the PIC dies and EIC dies to dissipate thermal energy generated by the EICs and/or PICs and keep the device at cryogenic temperatures.

Techniques disclosed herein can be used to assemble one or more photonic integrated circuits and one or more electronic integrated circuits in a same package. The photonic integrated circuits and electronic integrated circuits may be stacked face-to-face (with the photonic integrated circuits facing the electronic integrated circuits) to reduce the length of the interconnects and the size of the package and thus improve the achievable clock speed of the system. The package can also accommodate optical and electrical connections between the photonic integrated circuits and electronic integrated circuits in the package and external circuits or systems. Some examples of these optical and electrical connections may include optical fiber bundles and ribbon cables. The materials and bonding techniques used herein can minimize the thermal resistance at the interfaces between components, improve overall thermal conductivity, minimize thermal gradient, and match coefficients of thermal expansion (CTE), such that the package may allow the photonic integrated circuits and/or electronic integrated circuits to operate at cryogenic temperatures, such as below 10 K or below 5 K. Cooling plates attached to the PIC dies and EIC dies can dissipate thermal energy through short paths to minimize the effect of thermal energy generated by one circuit (e.g., an EIC) on another circuit (e.g., a PIC).

Several illustrative embodiments will now be described with respect to the accompanying drawings. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

According to certain embodiments, photonic integrated circuits and electronic integrated circuits are integrated as close as possible in a same package to minimize the lengths of the interconnects between the photonic integrated circuits and the electronic integrated circuits, in order to achieve a higher speed and lower loss. In some systems, such as some optical quantum computers, the photonic integrated circuits may work in extreme conditions, such as cryogenic temperatures, while the electronic integrated circuits may generate a large amount of heat. In some embodiments, in order to integrate the photonic integrated circuits and the electronic integrated circuits in a same package and achieve high performance in the appropriate working conditions, cooling plates are attached to the photonic integrated circuits and/or the electronic integrated circuits to dissipate thermal energy generated by the EICs and/or PICs and keep the device at cryogenic temperatures.

FIG. 1 is a flow chart 100 illustrating an example of a process for integrating photonic integrated circuits and electronic integrated circuits in a same package according to certain embodiments. Optionally, at block 110, die stacks that each include a PIC die and an EIC die bonded face-to-face may be manufactured. The die stacks may be manufactured by bonding a silicon PIC wafer and a silicon EIC wafer to form a wafer stack, and cutting the wafer stack (for example, by laser or plasma scribing or grinding) to separate each die area that includes a PIC die and an EIC die. More details of an example of a process for manufacturing the die stacks are described below with respect to FIG. 2.

At block 120, a substrate, such as a silicon handle wafer or a metal plate, may be bonded with the backside (i.e., the substrate) of the PIC die through, for example, fusion bonding as described in detail below. In other embodiments, the substrate can be bonded to the backside of the EIC die through similar means. In either case, the substrate (e.g., the silicon handle wafer), the PIC die, and the EIC die may all include a silicon substrate and may be bonded to form chemical bonds at the interfaces between adjacent substrates. Therefore, the CTEs of the three substrates may be matched and the total thermal resistance from the EIC die to the silicon handle wafer may be relative low because the thermal resistance at the interfaces may be reduced by the bonding.

At block 130, PCBs that have been manufactured and tested may be cut (if needed), aligned, and attached to the substrate (e.g., silicon handle wafer or metal plate) at areas where no PIC/EIC die stacks are bonded. The bonding method may depend on the material of the PCBs. For example, if silicon is used for the PCBs, fusion bonding techniques may be used. If oxides (e.g., silicon dioxide) are used for the PCBs, a hybrid bonding technique may be used. If other materials are used for the PCBs, an epoxy or an adhesive may be used to attach the PCBs to the substrate. In some embodiments, multiple PCB boards may be used in the same package and may be arranged at different horizontal or vertical locations. For example, in some embodiments, one PCB may be positioned on each side of a die stack. In some embodiments, two or more PCB boards may be positioned vertically with one on top of another.

Optionally, at block 140, through-glass vias (TGVs) that have been manufactured and tested may be cut (if needed), aligned, and attached to the PIC, where the TGVs may be in electrical and physical contact with pads or electrical circuits (e.g., traces) on the PIC. The TGVs may be used to deliver power or data signals to the PIC and EIC in a die stack.

At block 150, solder pads on the PCBs may be wire-bonded to the die stack. In some embodiments, solder pads on the PCBs may be wire-bonded to the TGVs. In some embodiments, solder pads on the PCBs may be wire-bonded to bonding pads on the EIC die, where the bonding pads may be connected to circuits on the EIC die by through-silicon vias (TSVs). In some embodiments, solder pads on the PCBs may be wire-bonded to bonding pads on the PIC.

At block 160, a top cooling plate may be bonded to the die stack. For example, a silicon substrate or a metal plate with micro-machined or etched mesa structures may be bonded to the back side of the EIC die, where the mesa structures may be in contact with the substrate of the EIC die. In some embodiments, the mesa structures may be coated with one or more metal layers (such as a 3-D printed gold or gold alloy layer) or an epoxy. In some embodiments, the top cooling plate may be bond to the die stack after the assembled device is tested at, for example, room temperature.

Optionally, at block 170, optical fibers may be attached to the PIC die and the PCBs. For example, the optical fibers may be attached to V-grooves on the PIC die and attached to the PCBs through fiber harnesses. In some embodiments, more than 100 optical fibers or more than 200 optical fibers may be attached to each of two sides of the PIC die. In some embodiments, an additional PCB board may be placed above the optical fibers such that the optical fibers may be sandwiched by the two PCB boards. This may allow for easier attachment and more secure and reliable integration of the optical fibers with PIC die.

It should be appreciated that the specific steps illustrated in FIG. 1 provide a particular method of integrating photonic integrated circuits and electronic integrated circuits in a same package according to another embodiment of the present invention. Other sequences of steps may also be performed according to alternative embodiments. For example, alternative embodiments of the present invention may perform the steps outlined above in a different order. Moreover, the individual steps illustrated in FIG. 1 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 2:
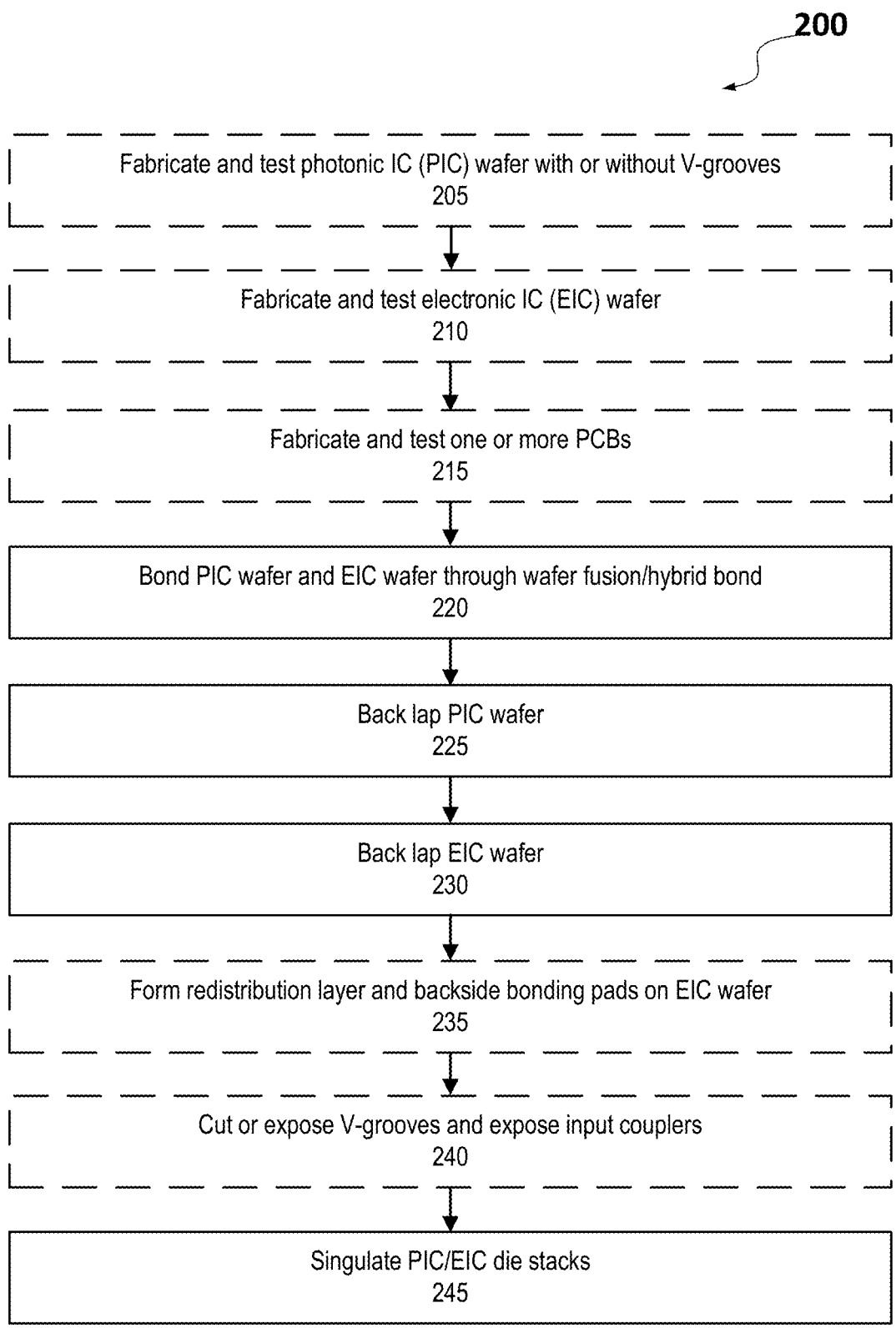
FIG. 2 is a flow chart illustrating an example of a process for integrating photonic integrated circuits and electronic integrated circuits in a die stack according to certain embodiments.
Figure 3A:
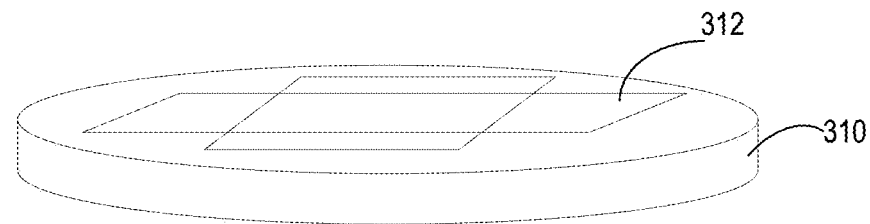
FIG. 3A illustrates an example of a silicon wafer with photonic integrated circuits fabricated thereon according to certain embodiments.

FIG. 2 is a flow chart illustrating an example of a process 200 for integrating photonic integrated circuits and electronic integrated circuits in a die stack (as described with respect to block 110 of FIG. 1) according to certain embodiments. Process 200 may include, at block 205, fabricating photonic integrated circuits on semiconductor wafers, such as silicon wafers, using semiconductor processing equipment and technology. The photonic integrated circuits may include, for example, waveguides, resonators, photon detectors, interferometers, gratings, and the like. In some embodiments the PICs are tested to exclude defective circuits before assembly because it may be more expensive to find and reject defective assembled devices that may include other properly functioning components at a later stage. Operations at block 205 may also include testing the photonic integrated circuits on the semiconductor wafers. For example, in some embodiments, additional couplers (e.g., grating couplers) may be manufactured on the semiconductor wafer and may be used as optical test ports for coupling light into or out of the photonic integrated circuits during testing. The additional couplers may be removed at a later stage of process 200 described below. In some embodiments, V-grooves for aligning and coupling optical fibers with waveguides in the PICs may also be fabricated on the semiconductor wafer. FIG. 3A illustrates an example of a silicon wafer 310 with photonic integrated circuits 312 fabricated thereon (with or without the V-grooves) according to certain embodiments.

Figure 3B:
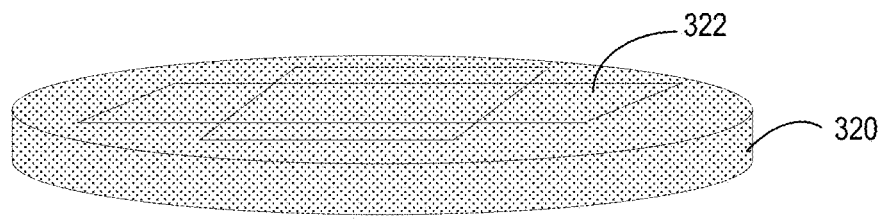
FIG. 3B illustrates an example of a silicon wafer with electrical integrated circuits fabricated thereon according to certain embodiments.

At block 210, electronic integrated circuits may be fabricated on semiconductor wafers, such as silicon wafers, using semiconductor processing equipment and technology (e.g., CMOS technology). The electronic integrated circuits may include, for example, control circuits, logic circuits, driver circuits, and the like. In some embodiments, through-silicon vias (TSVs) may be formed in EIC wafer. The manufactured integrated circuits on the electronic integrated circuit wafer may be tested to reject defective circuits before assembling with the PICs. FIG. 3B illustrates an example of a silicon wafer 320 with electrical integrated circuits 322 fabricated thereon according to certain embodiments.

At block 215, printed circuit boards (PCBs) may be fabricated and tested. The PCBs may be used to provide connections to an external system, to provide a power distribution network (e.g., power layers and ground layers), and to include some electronic components, such as voltage regulators and decoupling capacitors in the package. The PCBs may also include, for example, electrical cable connection ports, such as ribbon cable connectors, RF/microwave connectors (e.g., SMA connectors), and the like. In some embodiments, the PCBs may also include fiber cable harnesses and/or electric cable harnesses. In some embodiments, the PCBs may be made of a ceramic material, silicon, CTE-matched silicon dioxide, or an organic material (e.g., resin). In various embodiments, one or more PCB boards may be used in a package. For example, one PCB board may be below the fiber cable and another PCB board may be above the fiber cable to sandwich the fiber cable. This may allow for easier attachment and more secure and reliable integration of the fiber cable with the PICs.

Figure 3C:
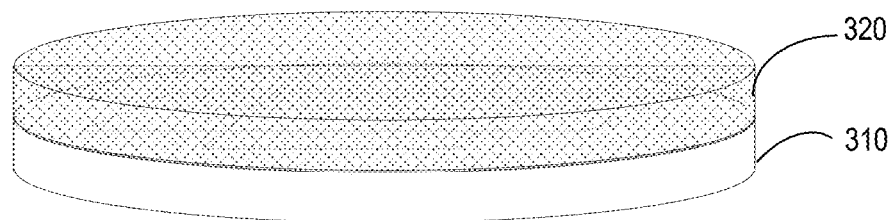
FIG. 3C illustrates an example of a wafer stack including a silicon wafer with photonic integrated circuits fabricated thereon and a silicon wafer with electrical integrated circuits fabricated thereon according to certain embodiments.

At block 220, a PIC wafer manufactured and tested at block 205 and an EIC wafer manufactured and tested at block 210 may be aligned and bonded through wafer-to-wafer fusion or hybrid bonding to form a wafer stack. Wafer-to-wafer fusion bonding may bond two wafers without any intermediate layers and is based on chemical bonds between the surfaces of two wafers that meet certain conditions. For example, fusion bonding may be used to bond two silicon wafers. Wafer-to-wafer fusion bonding may include wafer cleaning and other preprocessing, aligning and pre-bonding at room temperature, and annealing at elevated temperatures, such as about 250° C. or higher. Fusion bonding can significantly reduce or substantially eliminate the thermal resistance at the interface between two wafers. In some embodiments, wafer-level metal/adhesive hybrid bonding may be used to bond two wafers with dielectric materials (e.g., oxide) and/or metal at the surface of one or both wafers. Dielectric bonds and/or metal bonds may be formed at the interface between two wafers by the hybrid bonding. Hybrid bonding may include, for example, wafer cleaning, surface activation (e.g., plasma activation), pre-bonding, and annealing at, for example, 250-300° C. or higher. FIG. 3C illustrates an example of a wafer stack including silicon wafer 310 with photonic integrated circuits fabricated thereon and silicon wafer 320 with electrical integrated circuits fabricated thereon.

At blocks 225 and 230, the PIC wafer and the EIC wafer may be back-grinded (or back lapped) to make the wafer stack including the PIC wafer and EIC wafer thinner. For example, the PIC wafer may be back lapped from about 775 µm to about 100-600 µm. The EIC wafer may be back grinded from about 775 µm to about 50 µm or until the through-silicon vias (TSVs) are exposed.

Figure 3D:
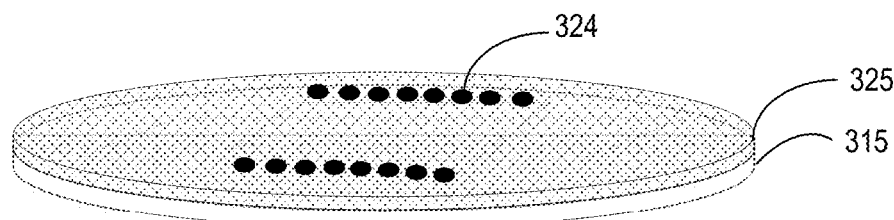
FIG. 3D illustrates an example of a wafer stack including two bonded silicon wafers after back lapping (or back grinding) and bonding pad formation according to certain embodiments.

At block 235, one or more redistribution layers (RDLs) may be formed on the backside of the EIC wafer, and bonding pads may be formed on the redistribution layer. The bonding pads may be used to make connections with the EIC. FIG. 3D illustrates an example of a wafer stack including two bonded silicon wafers 315 and 325 after back lapping (or back grinding) and bonding pad formation according to certain embodiments. Bonding pads 324 may be formed on the back side of back-grinded silicon wafer 325 according to a desired pattern.

Figure 4A:
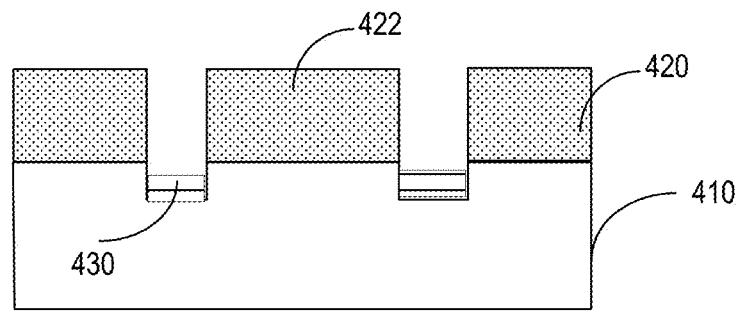
FIG. 4A illustrates an example of a stack including two bonded silicon wafers after a process that cuts or exposes V-grooves on the silicon wafer with photonic integrated circuits fabricated thereon according to certain embodiments.

At block 240, the EIC wafer and the PIC wafer may be etched to cut through portions of the thinned EIC wafer and/or form V-grooves on the PIC wafer. The V-grooves may be used to align and couple optical fibers with waveguides in the PIC. In some embodiments, the V-grooves may be formed before bonding the PIC wafer with the EIC wafer. In some embodiments in which optical test ports are fabricated on the PIC wafer for testing the PIC wafer, the optical test ports may be removed by the etching, and the input ports (e.g., edge couplers) to the waveguides may be exposed. FIG. 4A illustrates an example of a wafer stack including two bonded silicon wafers 410 and 420 after a process that cuts V-grooves 430 on silicon wafer 410 with photonic integrated circuits fabricated thereon according to certain embodiments, where the V-grooves are not fabricated on silicon wafer 410 as a part of the PIC fabrication process described above with respect to block 205. If V-grooves are fabricated on silicon wafer 410 as a part of the PIC fabrication process described above, portions of silicon wafer 420 may be cut through to expose the V-grooves on silicon wafer 410. Silicon wafer 420 may be cut into several EIC dies 422.

Figure 4B:
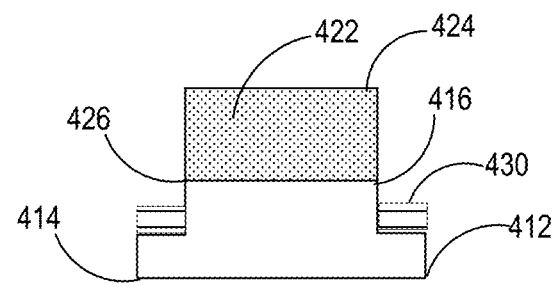
FIG. 4B illustrates an example of a singulated die stack including a photonic integrated circuit (PIC) die and an electronic integrated circuit (EIC) die according to certain embodiments.

At block 245, the wafer stack including the PIC wafer and the EIC wafer may be cut by, for example, laser or plasma scribing or grinding, to separate each die area that includes a PIC die and an EIC die. The cutting may be performed at areas where the V-grooves are formed as described above with respect to block 240. FIG. 4B illustrates an example of a singulated die stack including a PIC die 412 and an EIC die 422 according to certain embodiments. The V-shapes of V-grooves 430 extend into and out of the cross-sectional plane illustrated in FIG. 4, and fibers can be fit in V-grooves 430 from the two sides (e.g., left and right sides shown in FIG. 4B) of the singulated die stack. EIC die 422 may include a back surface 424 and a front surface 426 that may include circuits and contact pads. Back surface 424 of EIC die 422 may include bonding pads (not shown in FIG. 4B). PIC die 412 may include a back surface 414 and a front surface 416 that may include circuits and contact pads. Front surface 426 of EIC die 422 may be in contact with front surface 416 of PIC die 412, and thus EIC die 422 and PIC die 412 are bonded face-to-face.

It should be appreciated that the specific steps illustrated in FIG. 2 provide a particular method of integrating photonic integrated circuits and electronic integrated circuits in a die stack according to another embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 4C:
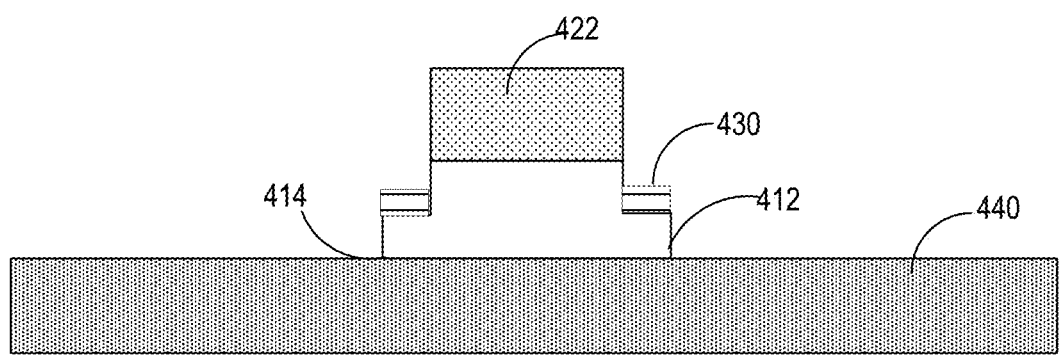
FIG. 4C illustrates an example of a singulated die stack including a PIC die and an EIC die and bonded on a silicon handle wafer according to certain embodiments.

As described above with respect to block 120 of FIG. 1, a semiconductor wafer, such as a silicon handle wafer, may be bonded with the backside (i.e., the substrate) of the PIC die though, for example, fusion bonding as described above. Thus, a stack may include the silicon handle wafer, the PIC die, and the EIC die, which may all include a silicon substrate and may be bonded to form chemical bonds at the interfaces between adjacent substrates. Therefore, the CTEs of the three substrates may be matched and the total thermal resistance from the EIC die to the silicon handle wafer may be relative low because the thermal resistance at the interfaces is minimized. FIG. 4C illustrates an example of a singulated die stack including PIC die 412 and EIC die 422 and bonded on a silicon handle wafer 440 according to certain embodiments. As illustrated, silicon handle wafer 440 may be bonded with the substrate of PIC die 412 at back surface 414.

Figure 4D:
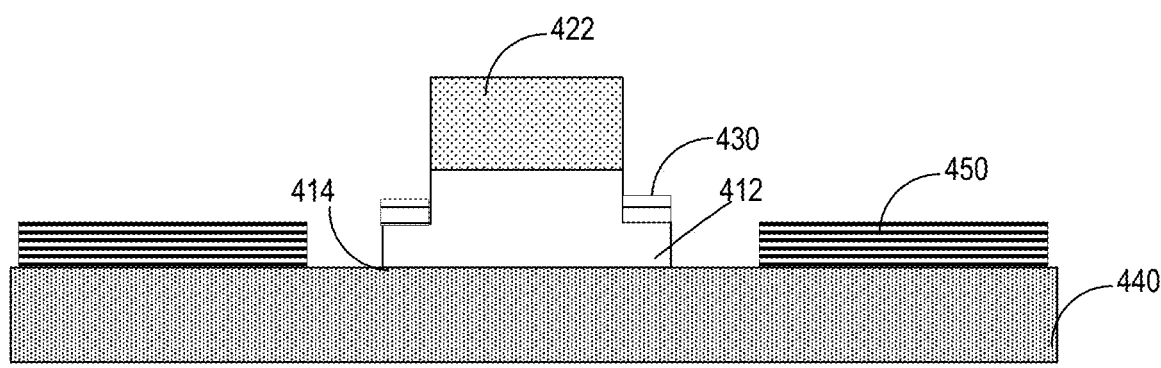
FIG. 4D illustrates an example of a package including a printed circuit board (PCB) and a die stack bonded on a silicon handle wafer according to certain embodiments.

The PCB manufactured and tested may be cut (if needed), aligned, and attached to the silicon handle wafer at areas where no PIC/EIC die stacks are bonded. The bonding method may depend on the material of the PCBs. For example, if silicon is used for the PCBs, fusion bonding techniques may be used. If oxides, such as silicon dioxide, are used for the PCBs, a hybrid bonding technique may be used. If other materials are used for the PCBs, an epoxy or an adhesive may be used to attach the PCBs to the silicon handle wafer. FIG. 4D illustrates an example of a package including a single printed circuit board (PCB) 450 and a die stack including PIC die 412 and EIC die 422 bonded on silicon handle wafer 440 according to certain embodiments. As described above, in some embodiments, multiple PCB boards may be used in the same package and may be arranged at different horizontal or vertical locations. For example, in some embodiments, one PCB may be positioned on each side of the die stack. In some embodiments, two or more PCB boards may be positioned vertically with one on top of another. In some embodiments, PCB 450 may include a semiconductor substrate, such as a silicon substrate.

Subsequently, the bonding pads on EIC die and the solder pads on PCB may be connected using bonding wires. In some embodiments, optical fibers may be attached to the PIC die and the PCB. For example, the optical fibers may be attached to the V-grooves on the PIC die and attached to the PCB through fiber harnesses. In some embodiments, more than 100 optical fibers or more than 200 optical fiber may be attached to each of two sides of the PIC die. In some embodiments, an additional PCB board may be placed above the optical fibers and PCB 450 such that the optical fibers may be sandwiched by the two PCB boards. This may allow for easier attachment and more secure and reliable integration of the optical fibers with PIC die 412.

Figure 5A:
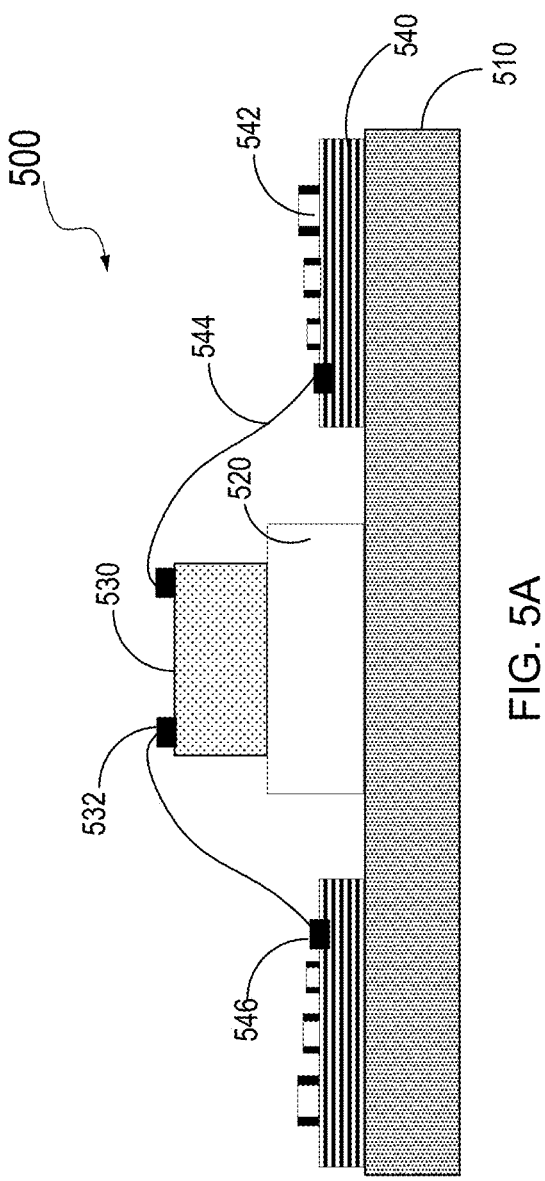
FIG. 5A is a cross-sectional view of an example of a package including a printed circuit board (PCB) and a die stack bonded on a silicon handle wafer, where the die stack is wire-bonded to the PCB according to certain embodiments.

FIG. 5A is a cross-sectional view of an example of a package 500 including a printed circuit board (PCB) 540 and a die stack including a PIC die 520 and an EIC die 530 bonded on a silicon handle wafer 510 according to certain embodiments. PCB 540 may include various electronic components soldered on it, such as decoupling capacitors 542 or cable connectors for ribbon cables or RF/microwave cables. FIG. 5A shows that bonding pads 532 on backside of EIC die 530 are connected to solder pad 546 on PCB 540 through bonding wire 544.

Figure 5B:
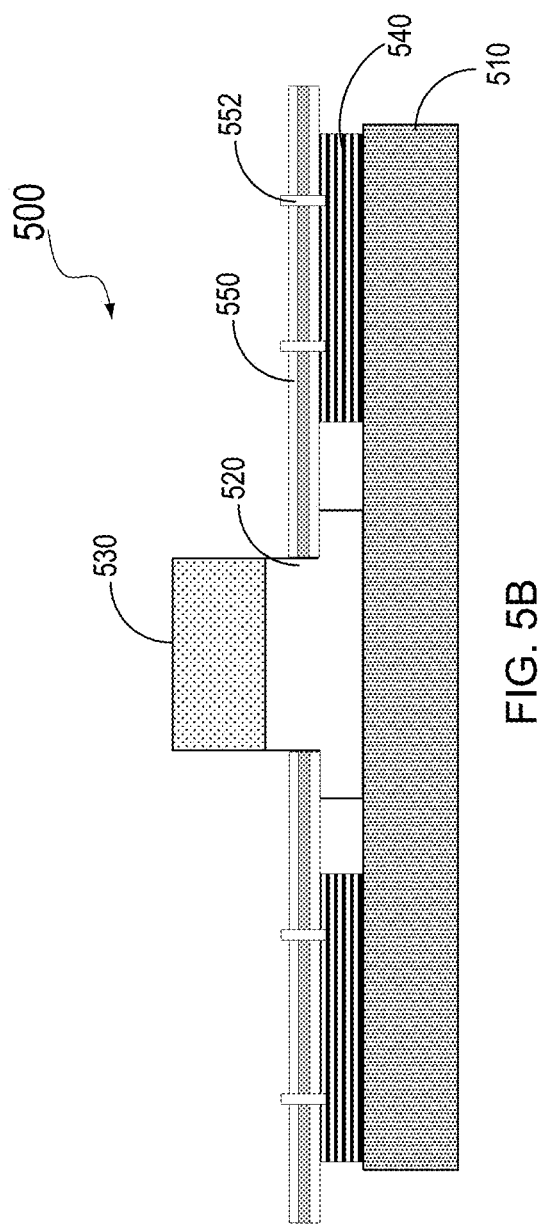
FIG. 5B is another cross-sectional view of an example of a package including a printed circuit board (PCB) and a die stack bonded on a silicon handle wafer, where optical fibers are coupled to the die stack and harnessed on the PCB according to certain embodiments.

FIG. 5B is another cross-sectional view of package 500 including printed circuit board (PCB) 540 and the die stack including PIC die 520 and EIC die 530 bonded on silicon handle wafer 510, where optical fibers 550 are coupled to PIC die 520 and attached to PCB 540 through a harness 552 according to certain embodiments. Optical fiber 550 may fit in the V-grooves on PIC die 520 and may be aligned with waveguides on PIC die 520 by the V-grooves on PIC die 520. Optical fiber 550 may be coupled to the waveguides through, for example, edge couplers as described above.

Figure 6:
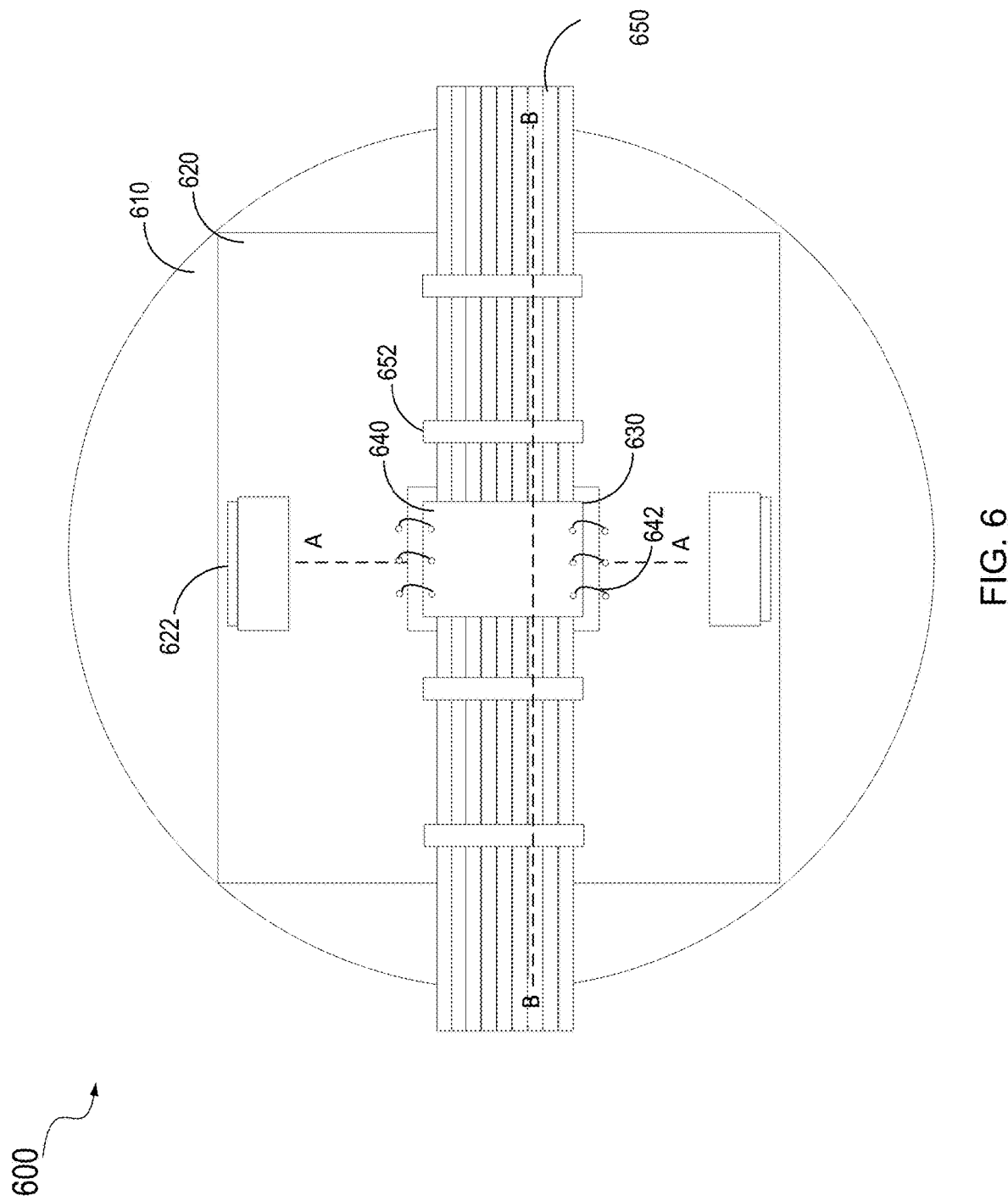
FIG. 6 is a top view of an example of a package that includes a PIC, an EIC, a PCB, electrical connectors, and optical fibers on a silicon handle wafer according to certain embodiments.

FIG. 6 is a top view of an example of a package 600 that includes a PIC die 630, an EIC die 640, a PCB 620, one or more electrical connectors 622, and optical fibers 650 on a silicon handle wafer 610. Even though FIG. 6 only shows one PIC/EIC die stack, multiple PIC/EIC die stacks may be included in package 600. As illustrated, a PCB 620 is attached to silicon handle wafer 610, e.g., using an epoxy or through fusion bonding or hybrid bonding, depending on the material of PCB 620. As described above, one or more PCBs 620 may be attached to silicon handle wafer 610 at different horizontal or vertical locations. A PIC/EIC die stack includes EIC die 640 bonded face-to-face with PIC die 630 (e.g., by fusion bonding or hybrid bonding) such that the PICS may directly face the EICs. The PIC/EIC die stack may be bonded to silicon handle wafer 610 by, for example, fusion bonding. EIC die 640 may be electrically connected to PCB 620 through bonding wires 642, where the bonding pads and bonding wires may only be at the top (north) and bottom (south) sides of the PIC/EIC die stack. The left (west) and right (east) sides of the PIC/EIC die stack may be coupled with optical fibers 650, where optical fibers 650 may be attached to PCB 620 through harnesses 652. PCB 620 may also include electrical connectors 622 and some other electronic components, such as voltage regulators, power management ICs, decoupling capacitors, etc.

Figure 7:
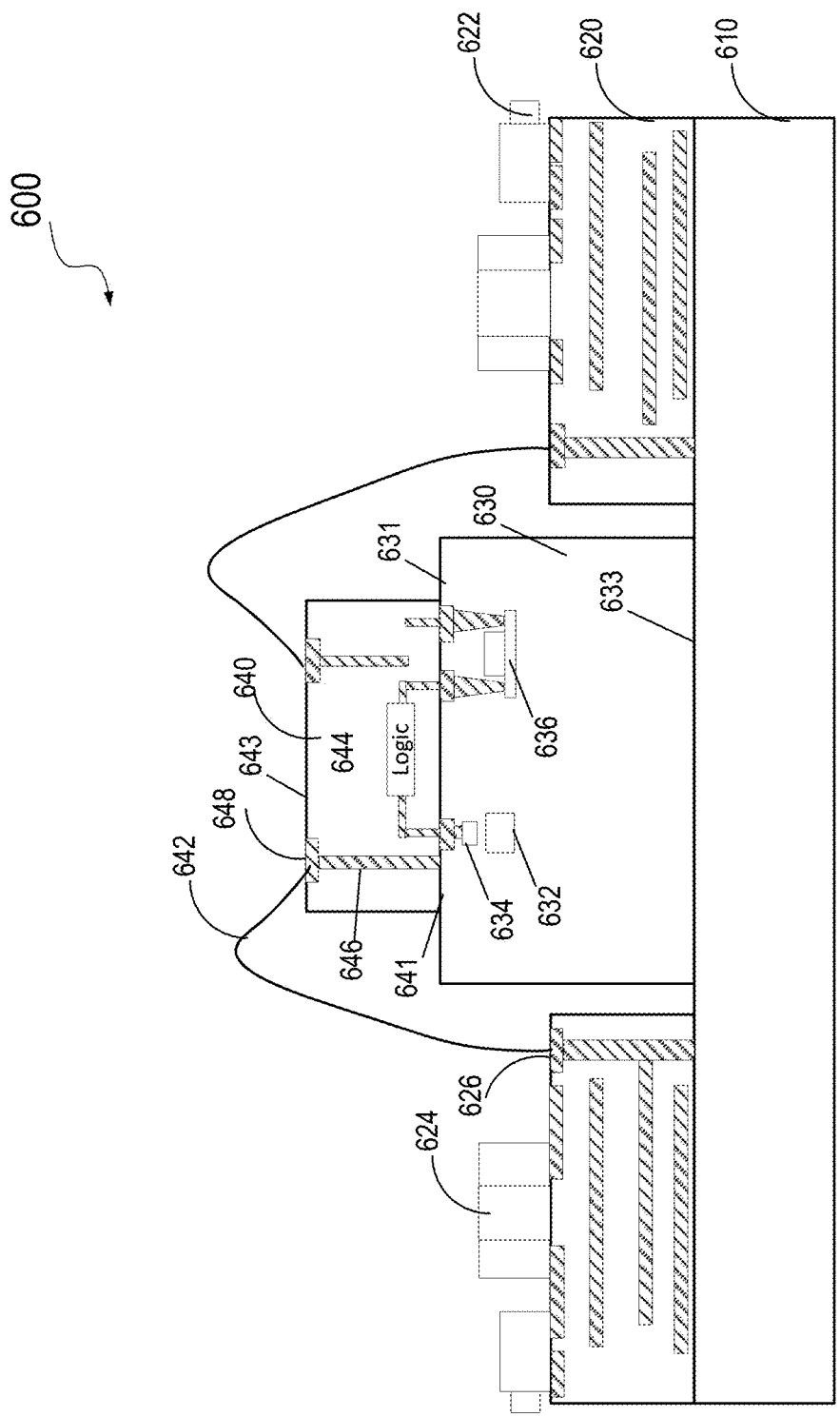
FIG. 7 is a cross-sectional view of the example package shown in FIG. 6 according to certain embodiments.

FIG. 7 is a cross-sectional view of package 600 along line A-A shown in FIG. 6 according to certain embodiments. FIG. 7 shows that PCB 620 and the PIC/EIC die stack are bonded to a top surface of silicon handle wafer 610. PCB 620 may include multiple layers of interconnect traces or planes connected through vias. Electronic components, such as electrical connector 622 and decoupling capacitors 624 may be soldered on the top surface of PCB 620. PCB 620 may also include solder pads 626 on the top surface of PCB 620. The PIC/EIC die stack may include PIC die 630 and EIC die 640. PIC die 630 may include a back surface 633 bonded to silicon handle wafer 610. PIC die 630 may also include a front surface 631 that may include circuits or pads.

EIC die 640 may include a back surface 643 that may include a redistribution layers and bonding pads 648. EIC die 640 may also include a front surface 641 that may include circuits or pads. EIC die 640 and PIC die 630 may be bonded face-to-face with each other such that front surface 631 of PIC die 630 and front surface 641 of EIC die 640 may directly face each other and the interconnections can be short. PIC die 630 may include waveguides 632 and 636, and photodetectors 634. EIC die 640 may include some through-silicon vias (TSVs) 646 and control logic circuits 644. A photodetector 634 may detect a single photon from waveguide 632, and send the detection result to control logic circuit 644, which may determine whether and how to tune waveguide 636 (e.g., to turn on or off an optical switch). Bonding pads 648 may be connected to control logic circuits 644 through TSVs, and may also be connected to solder pads 626 on PCB 620 through bonding wires 642.

Figure 8:
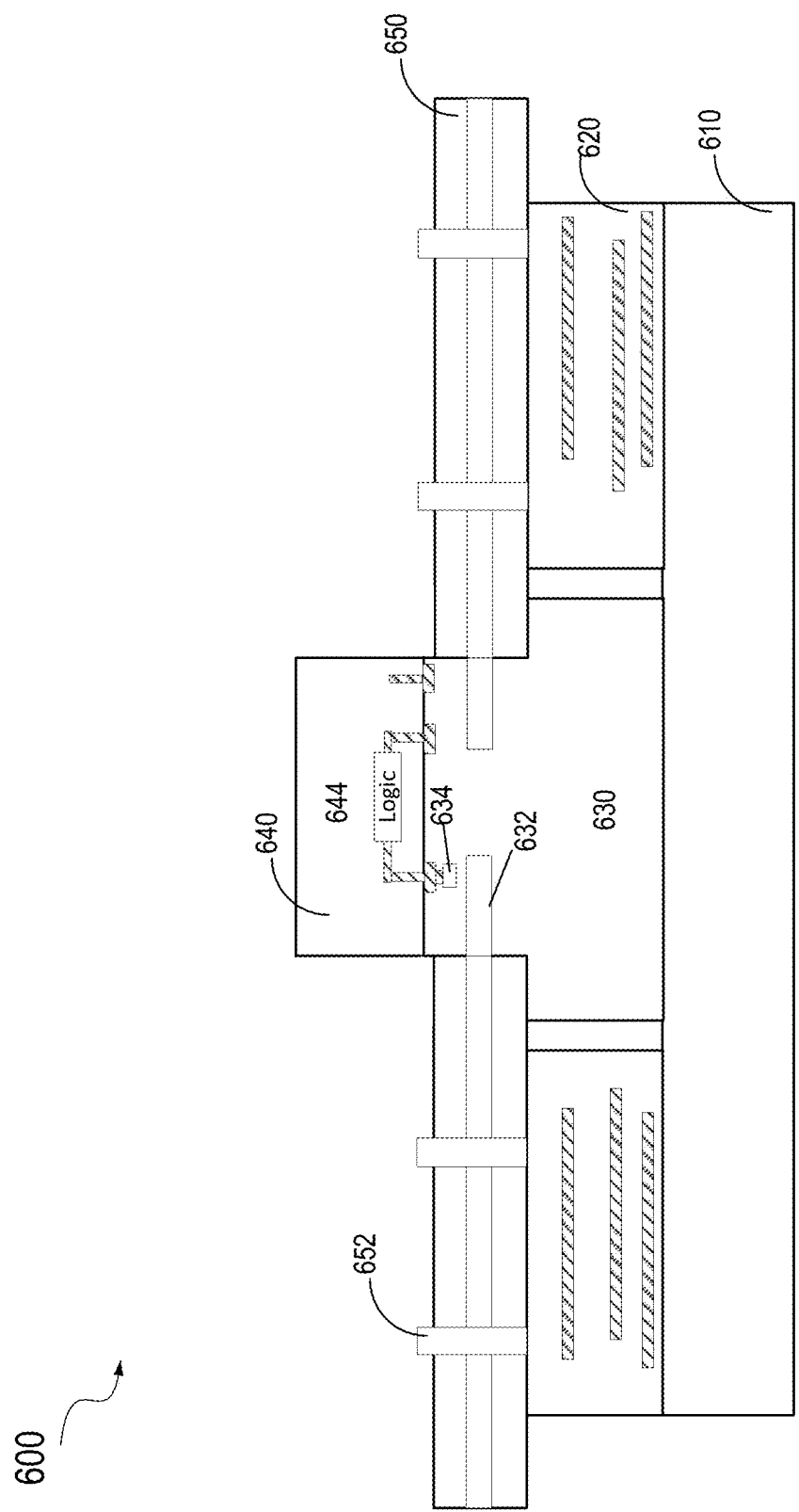
FIG. 8 is another across-sectional view of the example package shown in FIG. 6 according to certain embodiments.

FIG. 8 is another cross-sectional view of package 600 along line B-B shown in FIG. 6 according to certain embodiments. FIG. 8 shows that, in the B-B direction, optical fibers 650 may be attached to PCB 620 through harnesses 652. Optical fibers 650 may fit in V-grooves formed on PIC die 630, where the V-grooves may align with the waveguides on PIC die 630. Therefore, when assembled, the cores of optical fibers may align with corresponding cores of the waveguides on PIC die 630.

Figure 9:
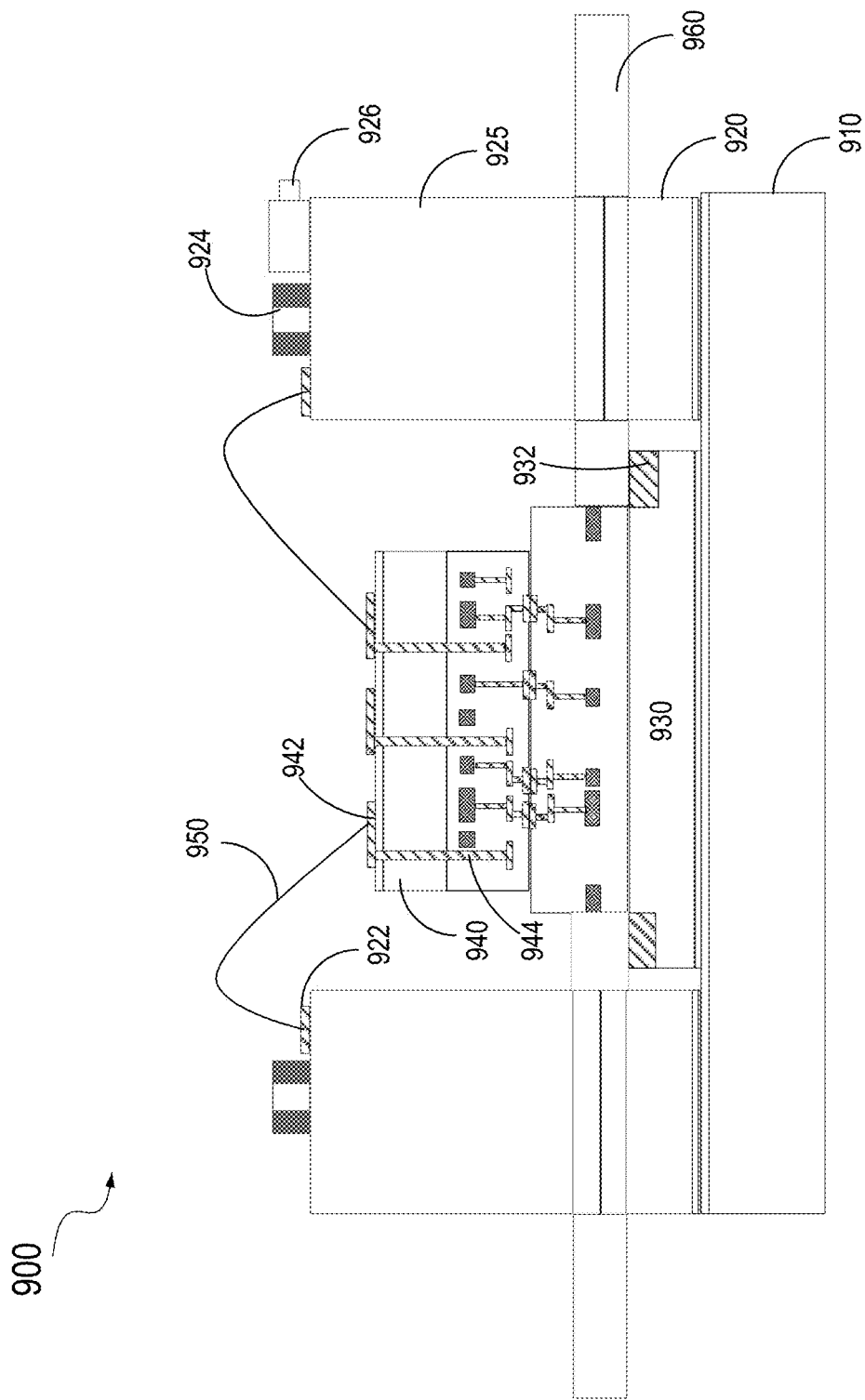
FIG. 9 is a cross-sectional view of an example of a package according to certain embodiments.

FIG. 9 is a cross-sectional view of an example of a package 900 according to certain embodiments. Package 900 may include a PIC die 930, an EIC die 940, and a PCB 920 on a silicon handle wafer 910. Even though FIG. 9 only shows one PIC/EIC die stack, multiple PIC/EIC die stacks can be included in package 900. As illustrated, PCB 920 may be attached to silicon handle wafer 910, e.g., using an epoxy or through fusion bonding or hybrid bonding, where the bonding method may depend on the material of PCB 920. As described above, one or more PCBs may be attached to silicon handle wafer 910 at different horizontal or vertical locations. For example, a second PCB 925 may be bonded on top of PCB 920. PCB 920 may also include electrical connectors 926 and some other electronic components, such as voltage regulators, power management ICs, decoupling capacitors 924, etc.

The PIC/EIC die stack may include EIC die 940 bonded face-to-face with PIC die 930 (e.g., by fusion bonding or hybrid bonding) such that the PICS may directly face the EICs and some pads or traces on the PICS and EICs may be in direct contact to minimize the lengths of the interconnects. The PIC/EIC die stack may be bonded to silicon handle wafer 910 by, for example, fusion bonding. EIC die 940 may include bonding pads 942 on the back side (i.e., substrate) of EIC die 940, where bonding pads 942 may be connected to the EICs on EIC die 940 through TSVs 944 as described above with respect to, for example, FIG. 7. EIC die 940 may be electrically connected to PCB 920 by bonding wires 950 that may connect solder pads 922 on second PCB 925 and bonding pads 942 on the back side of EIC die 940.

Optical fibers 960 may be attached to PCB 920 and may fit in V-grooves 932 formed on PIC die 930. V-grooves 932 may align with the waveguides on PIC die 930. Therefore, when assembled, the cores of optical fibers 960 may align with corresponding cores of the waveguides on PIC die 930. As shown in FIG. 9, optical fibers 960 may be sandwiched between and secured by PCB 920 and second PCB 925. For example, optical fibers 960 may first be attached to PCB 920 and fit in V-grooves 932 to align with waveguides on PIC dies 930, and second PCB 925 may then be bonded on top of PCB 920 and optical fibers 960 to secure optical fibers 960.

Figure 10:
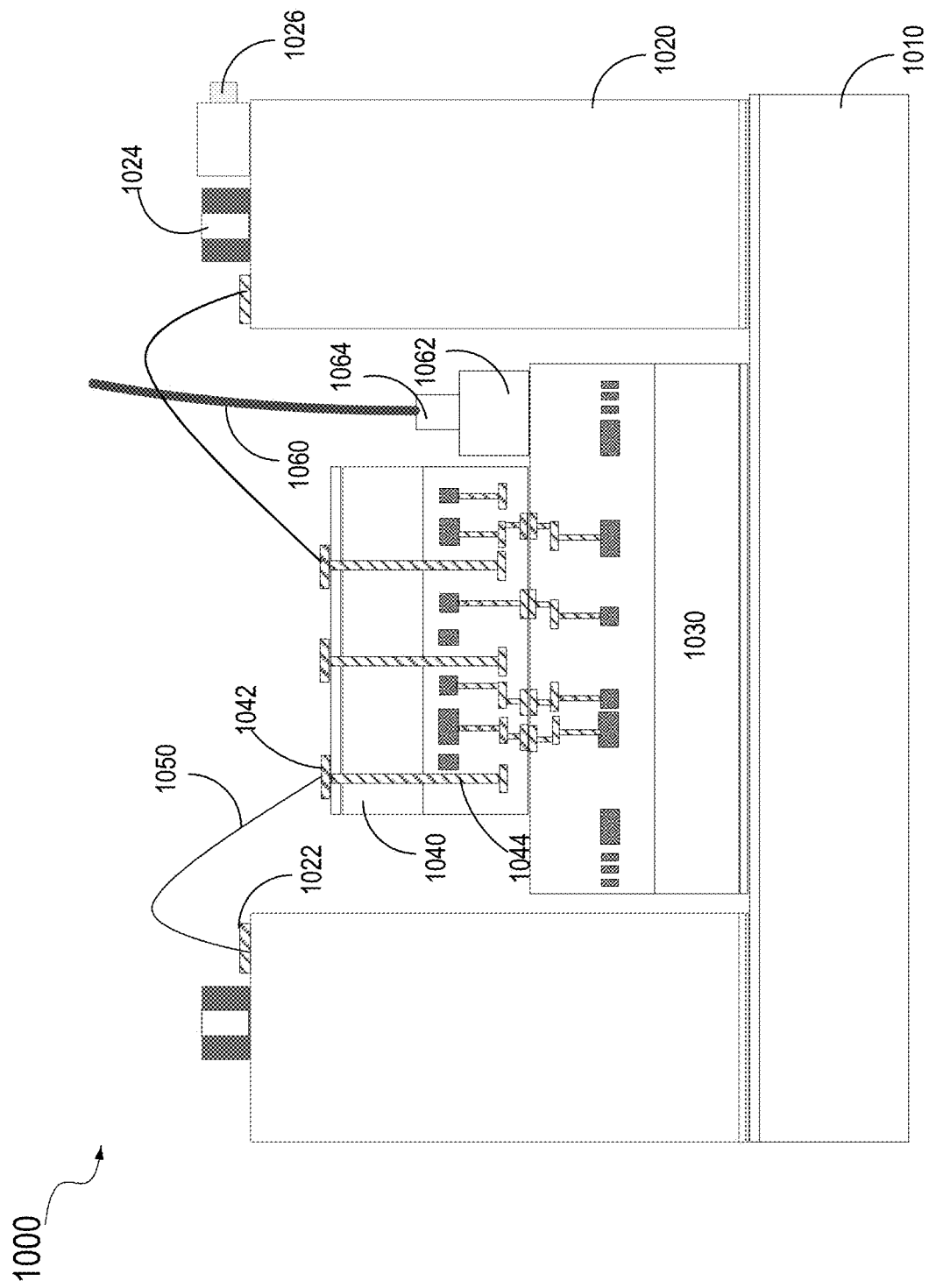
FIG. 10 is a cross-sectional view of an example of a package according to certain embodiments.

FIG. 10 is a cross-sectional view of an example of a package 1000 according to certain embodiments. Package 1000 may include a PIC die 1030, an EIC die 1040, and a PCB 1020 on a silicon handle wafer 1010. Even though FIG. 10 only shows one PIC/EIC die stack, multiple PIC/EIC die stacks can be included in package 1000. As illustrated, PCB 1020 may be attached to silicon handle wafer 1010, e.g., using an epoxy or through fusion bonding or hybrid bonding, where the bonding method may depend on the material of PCB 1020. PCB 1020 may have a height or thickness less than, equal to, or greater than the height or thickness of the PIC/EIC die stack that includes EIC die 1040 bonded with PIC die 1030. PCB 1020 may include electrical connectors 1026 and some other electronic components, such as voltage regulators, power management ICs, decoupling capacitors 1024, solder pads 1022, etc.

EIC die 1040 may be bonded face-to-face with PIC die 1030 (e.g., by fusion bonding or hybrid bonding) such that the PICS may directly face the EICs to reduce the length of the interconnects between the PICS and the EICs. The PIC/EIC die stack may be bonded to silicon handle wafer 1010 by, for example, fusion bonding. EIC die 1040 may include bonding pads 1042 on the back side of EIC die 1040, where bonding pads 1042 may be connected to the EICs on EIC die 1040 through TSVs 1044 as described above with respect to, for example, FIG. 7. EIC die 1040 may be electrically connected to PCB 1020 by bonding wires 1050, which may connect solder pads 1022 on PCB 1020 and bonding pads 1042 on the back side of EIC die 1040.

As shown in FIG. 10, optical fibers 1060 may be vertically coupled to the PICS on PIC die 1030 by one or more couplers 1062 (e.g., prisms). Couplers 1062 may be bonded to PIC die 1030 and may be aligned with the waveguides on PIC die 1030. Optical fibers 1060 may each include a collimation lens 1064 (e.g., a GRIN lens or a micro-lens) on one end, and may be coupled to couplers 1062 for coupling light from optical fibers 1060 into the waveguides on PIC die 1030.

Figure 11:
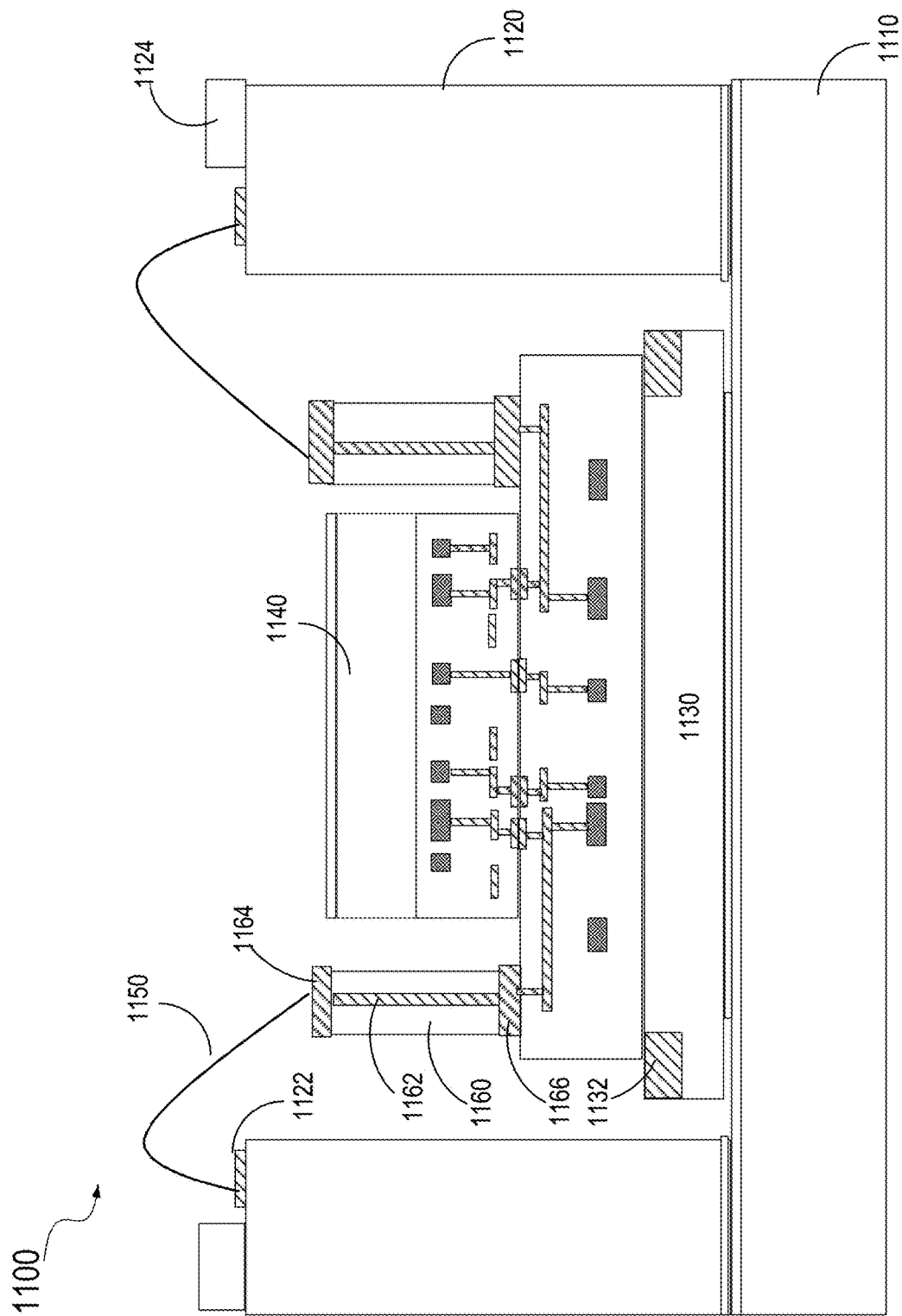
FIG. 11 is a cross-sectional view of an example of a package including through-glass vias (TGVs) according to certain embodiments.

FIG. 11 is a cross-sectional view of an example of a package 1100 including through-glass vias (TGVs) 1162 according to certain embodiments. Package 1100 may include a PIC die 1130, an EIC die 1140, and a PCB 1120 on a silicon handle wafer 1110. Even though FIG. 11 only shows one PIC/EIC die stack, multiple PIC/EIC die stacks can be included in package 1100 and bonded on silicon handle wafer 1110. As illustrated, PCB 1120 is attached to silicon handle wafer 1110, e.g., using an epoxy or through fusion bonding or hybrid bonding. As described above, one or more PCBs may be attached to silicon handle wafer 1110 at different horizontal or vertical locations. For example, PCB 1120 may include two or more PCBs bonded vertically as described above with respect to, for example, FIG. 9. PCB 1120 may also include some electronic components, such as voltage regulators, power management ICs, decoupling capacitors 1124, connectors, etc.

The PIC/EIC die stack may include EIC die 1140 bonded face-to-face with PIC die 1130 (e.g., by fusion bonding or hybrid bonding) such that the PICS may directly face the EICs. As described above, the PIC/EIC die stack may be bonded to silicon handle wafer 1110 by, for example, fusion bonding. EIC die 1140 may not include TSVs or bonding pads on the back side. Rather, a glass substrate 1160 with through-glass vias (TGVs) 1162 may be bonded to PIC die 1130. Contact pads 1166 on one side of glass substrate 1160 may be coupled to bonding pads 1164 on the other side of glass substrate 1160 through TGVs 1162. Contact pads 1166 may be coupled to the PICS on PIC die 1130 and/or the EICs on EIC die 1140. Bonding pads 1164 may be electrically connected to solder pads 1122 on PCB 1120 by bonding wires 1150. In some embodiments, glass substrate 1160 may have a length about 2-3 mm, a width about 1-3 mm, and a height about 20-25 mm.

Using TGVs instead of TSVs may leave more silicon areas for the EICs, and thus may reduce the size of EIC dies 1040. In addition, without TSVs on EIC die 1140, the processing steps for manufacturing EIC die 1140 may be significantly reduced, and thus may further reduce the cost of manufacturing EIC die 1140. Furthermore, glass (e.g., silicon dioxide) may be a much better insulator than silicon, and thus TGVs 1162 may have much lower RC losses than TSVs. In some embodiments, TGVs 1162 may include a power distribution network that may distribute electrical power from PCB 1120 to circuits or traces on PIC die 1130, which may then deliver the electrical power to circuits in EIC die 1140. For example, TGVs 1162 may distribute the electrical power from one bonding wire 1150 to multiple pads or traces on PIC die 1130 using multiple vias. In this way, the impedance of the power distribution network may be reduced and thus the IR losses (which may be converted to heat) can be reduced. In addition, the inductance of the power distribution network may be reduced and the response time of the power distribution network may be reduced (i.e., the bandwidth of the power distribution network may be increased).

Optical fibers may also be attached to PCB 1120 and may fit in V-grooves 1132 formed on PIC die 1130. V-grooves 1132 may align with the waveguides on PIC die 1130. Therefore, when assembled, the cores of the optical fibers in V-grooves 1132 may align with corresponding cores of the waveguides on PIC die 1130. As described above with respect to FIG. 9, the optical fibers may be sandwiched between and secured by PCB 1120.

The above described techniques can be used to assemble or package other circuits for the desired thermal and electrical performance. For example, the techniques can also be used to package one or more silicon ICs on a silicon-based package substrate, or package one or more ICs on a non-silicon package substrate.

Although not shown in the figures, in some embodiments, a cooling device (e.g., a cold head) may be attached to the silicon handle wafer (e.g., silicon handle wafer 440, 610, 910, 1010, or 1110) to cool down the PIC dies and/or the EIC dies such that the PICS and/or the EICs may work at the desired temperature, such as a cryogenic temperature.

In many circumstances, most of the thermal energy generated by the packaged device described above may be generated by the EICs on the EIC die. In some embodiments described above where the thermal energy generated by the EIC die may be dissipated through the PIC die and the handle wafer to the cooling device, the thermal energy generated by the EICs may affect the performance of the PICS. Thus, additional cooling mechanisms that can help to dissipate heat from the EIC through a more direct and shorter path, without going through the PICS, may help to maintain the cryogenic temperature at the PICS.

According to certain embodiments, an optional top cooling plate may be bonded to the EIC directly to conduct thermal energy from the EIC. The top cooling plate may be a silicon substrate similar to the silicon handle wafers described above, which may have a coefficients of thermal expansion (CTE) matching the CTE of the substrate of the EIC die. In some embodiments, the top cooling plate may include a metal plate or metal structure. The top cooling plate may include mesa structures formed thereon. For example, mesa structures may be formed on a silicon handle wafer or a metal plate by etching or micromachining. The top cooling plate may be bonded to one or more EIC dies through the mesa structures. In some embodiments, the mesa structures may be coated with one or more metal layers (e.g., gold, gold alloy, titanium, and nickel) or an epoxy layer to reduce the thermal resistance at the interface between the substrate of the EIC dies and the mesa structures.

Figure 12:
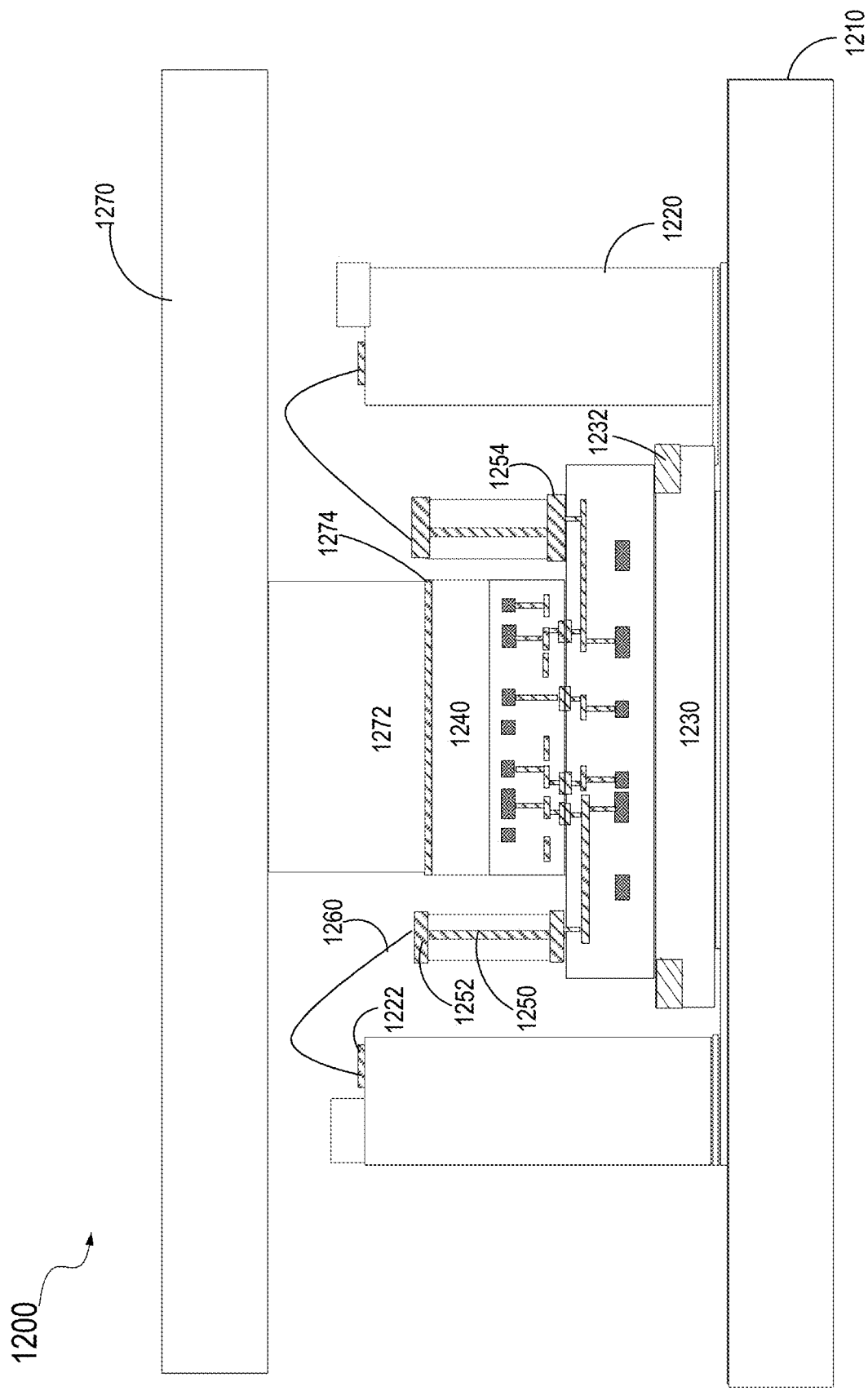
FIG. 12 is a cross-sectional view of an example of a package including TGVs and a top cooling plate according to certain embodiments.

FIG. 12 is a cross-sectional view of an example of a package 1200 including TGVs 1250 and a top cooling plate 1270 according to certain embodiments. As described above with respect to package 1100 of FIG. 11, package 1200 may also include a PIC die 1230, an EIC die 1240, and a PCB 1220 on a silicon handle wafer 1210. Even though FIG. 12 only shows one PIC/EIC die stack, multiple PIC/EIC die stacks can be bonded on silicon handle wafer 1210. As illustrated, PCB 1220 is attached to silicon handle wafer 1210, e.g., using an epoxy or through fusion bonding or hybrid bonding. As described above, one or more PCBs may be attached to silicon handle wafer 1210 at different horizontal or vertical locations. PCB 1220 may include some electronic components, such as voltage regulators, power management ICs, decoupling capacitors, connectors, etc.

EIC die 1240 and PIC die 1230 in the die stack may be bonded (e.g., by fusion bonding or hybrid bonding) face-to-face with each other such that the PICs may directly face the EICs. As described above, the PIC/EIC die stack may be bonded to silicon handle wafer 1210 by, for example, fusion bonding the substrate of PIC die 1230 to silicon handle wafer 1210. Through-glass vias (TGVs) 1250 may be bonded to PIC die 1230 as described above with respect to FIG. 11. Contact pads 1252 on one side of TGVs 1250 may be electrically connected to solder pads 1222 on PCB 1220 by bonding wires 1260. Contact pads 1254 on the other side of TGVs 1250 may be coupled to the PICs on PIC die 1230 and/or the EICs on EIC die 1240. PIC die 1230 may also include V-grooves 1232 aligned with the waveguides on PIC die 1130 for aligning optical fibers with the waveguides.

In some embodiments, package 1200 may also include a top cooling plate 1270 that includes one or more mesa structures 1272 formed thereon. In some embodiments, only mesa structures 1272 (e.g., a metal block) may be used. As described above, top cooling plate 1270 may be a silicon substrate similar to silicon handle wafer 1210, and may have a coefficients of thermal expansion (CTE) matching the CTE of the substrate of the EIC die 1240. In some embodiments, top cooling plate 1270 may include a metal plate. Mesa structures 1272 may be formed on top cooling plate 1270 (e.g., a silicon handle wafer or a metal plate) by etching or micromachining. Top cooling plate 1270 may be bonded to one or more EIC dies 1240 through mesa structures 1272. Because TGVs 1250, rather than TSVs in EIC die 1240, are used to connect PCB 1220 to the PICs and EICs, the contact area between EIC die 1240 and cooling plate 1270 may be maximized to improve the thermal conductivity. In some embodiments, the surface of mesa structures 1272 may be coated with one or more metal layers 1274 (e.g., including 3-D printed gold or gold alloy, titanium, or nickel) or an epoxy layer to improve the thermal conductivity at the interface between the substrate of EIC dies 1240 and mesa structures 1272. In some embodiments, the area on EIC die 1240 that may contact a mesa structure 1272 may also be coated with a metal layer or an epoxy before bonding with mesa structure 1272. In some embodiments, a cooling device (e.g., a cold head) may be attached to the top cooling plate to take heat away from EIC die 1240.

Figure 13:
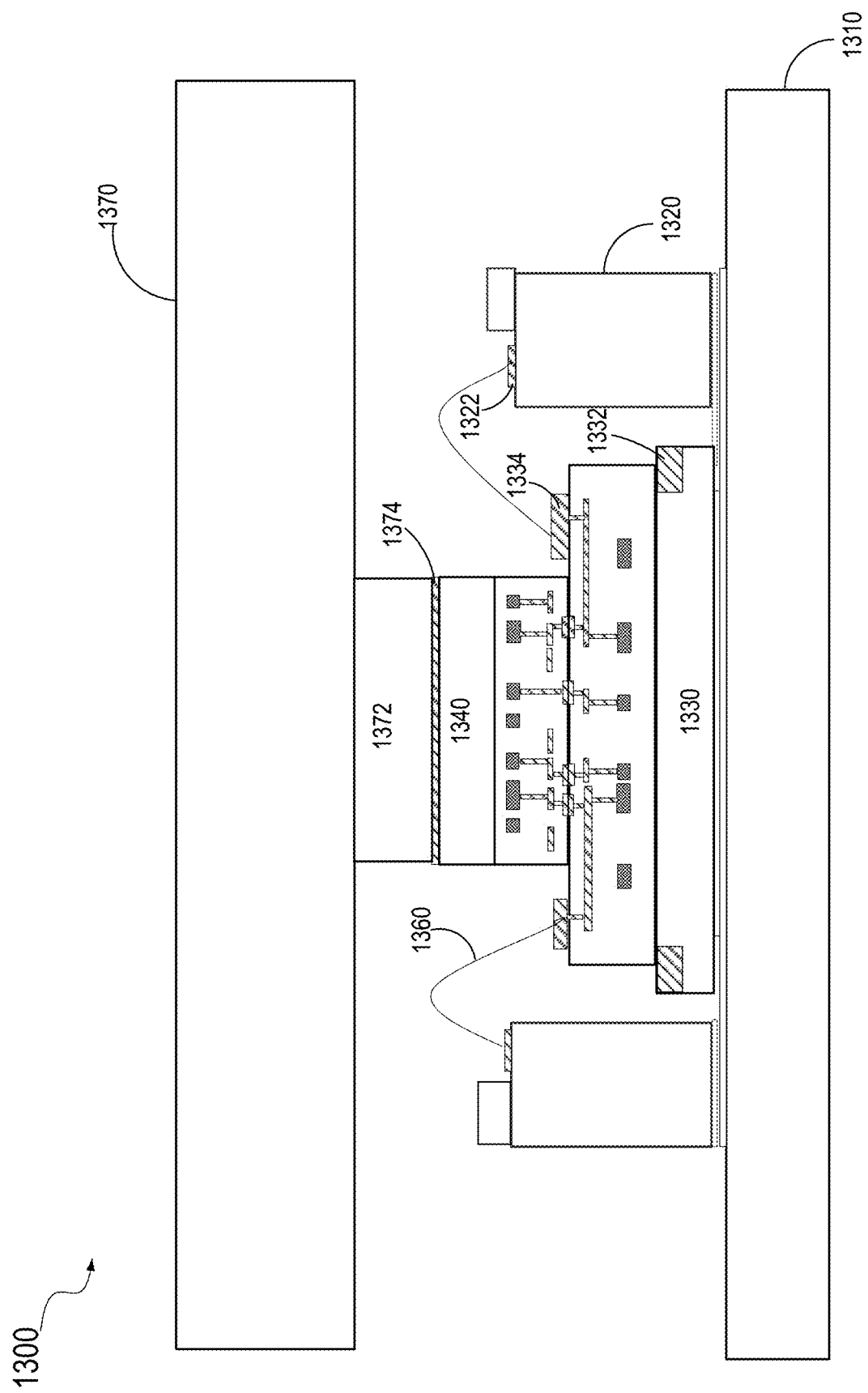
FIG. 13 is a cross-sectional view of an example of a package including a top cooling plate according to certain embodiments.

FIG. 13 is a cross-sectional view of an example of a package 1300 including a top cooling plate 1370 according to certain embodiments. Package 1300 may be similar to package 1200, but may not use TGVs. Package 1300 may also include a PIC die 1330, an EIC die 1340, and a PCB 1320 bonded on a handle wafer 1310. Even though FIG. 13 only shows one PIC/EIC die stack, multiple PIC/EIC die stacks can be bonded on handle wafer 1310. PCB 1320 may be attached to handle wafer 1310, e.g., using an epoxy or through fusion bonding or hybrid bonding. EIC die 1340 and PIC die 1330 in a die stack may be bonded (e.g., by fusion bonding or hybrid bonding) face-to-face with each other, and the PIC/EIC die stack may be bonded to handle wafer 1310 by, for example, fusion bonding the substrate of PIC die 1330 to handle wafer 1310. Contact pads 1334 on PIC die 1330 may be electrically connected to solder pads 1322 on PCB 1320 by bonding wires 1360. PIC die 1330 may also include V-grooves 1332 aligned with the waveguides on PIC die 1130 for aligning optical fibers with the waveguides.

Package 1300 may also include a top cooling plate 1370 that includes one or more mesa structures 1372 formed thereon. Top cooling plate 1370 may be similar to top cooling plate 1270, and may be bonded to one or more EIC dies 1340 through mesa structures 1372. In some embodiments, the surface of mesa structures 1372 may be coated with one or more metal layers 1374 (e.g., including 3-D printed gold or gold alloy, titanium, or nickel) or an epoxy layer to improve the thermal conductivity at the interface between the substrate of EIC dies 1340 and mesa structures 1372. In some embodiments, the area on the substrate of EIC die 1340 that may contact a mesa structure 1372 may also be coated with a metal layer or an epoxy before bonding with mesa structure 1372. In some embodiments, a cooling device (e.g., a cold head) may be attached to the top cooling plate to take heat away from EIC die 1340. Because no TSVs are used in EIC die 1340, the contact area between the substrate of EIC die 1340 and mesa structure 1372 may be maximized to improve the thermal conductivity at the interface between EIC die 1340 and mesa structure 1372.

Figure 14:
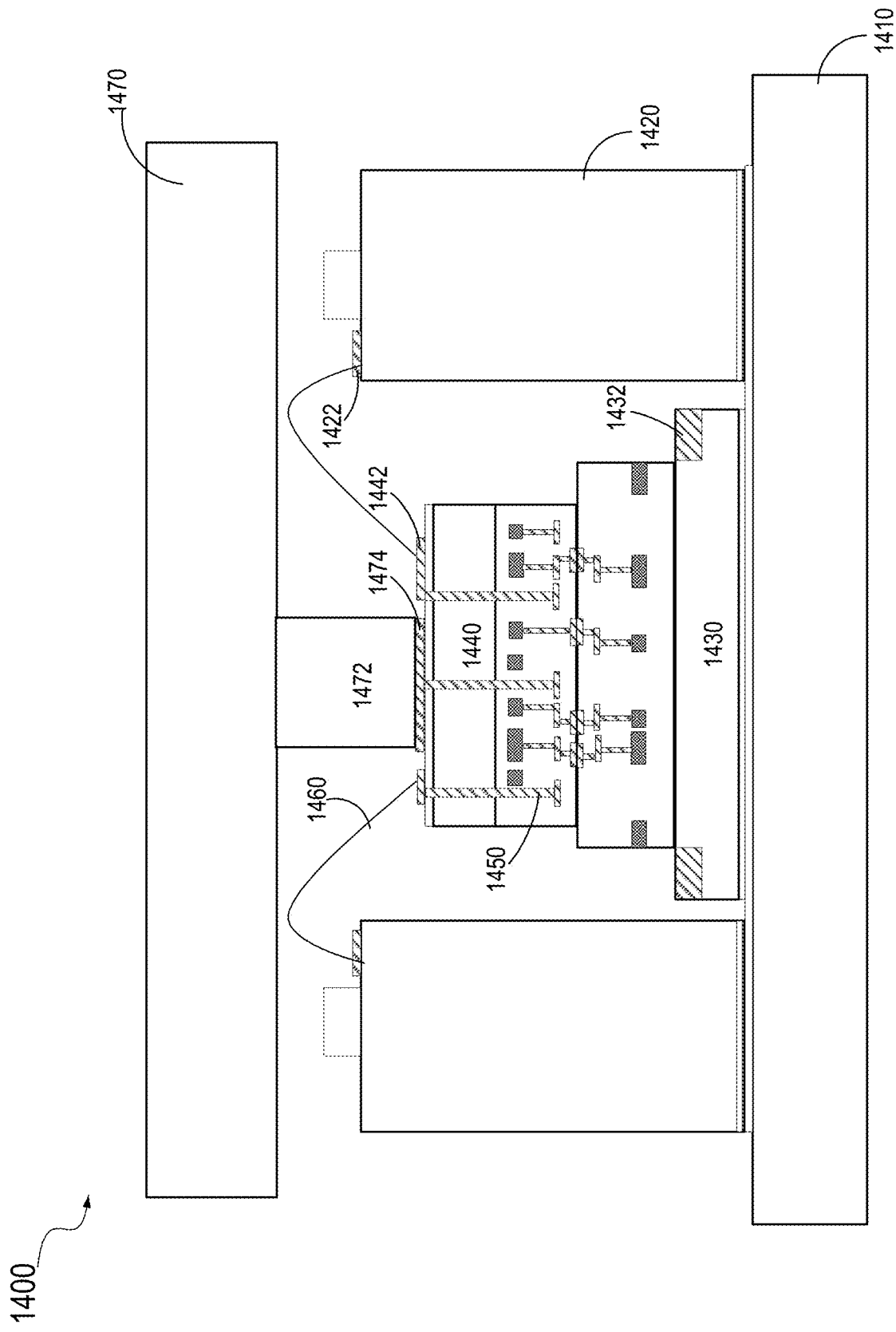
FIG. 14 is a cross-sectional view of an example of a package including a top cooling plate according to certain embodiments.

FIG. 14 is a cross-sectional view of an example of a package 1400 including a top cooling plate 1470 according to certain embodiments. Package 1400 may be similar to package 900, and may include a PIC die 1430, an EIC die 1440, and a PCB 1420 bonded on a handle wafer 1410. Even though FIG. 14 only shows one PIC/EIC die stack, multiple PIC/EIC die stacks can be bonded on handle wafer 1410. PCB 1420 may be attached to handle wafer 1410, e.g., using an epoxy or through fusion bonding or hybrid bonding. EIC die 1440 and PIC die 1430 in a die stack may be bonded (e.g., by fusion bonding or hybrid bonding) face-to-face with each other, and the PIC/EIC die stack may be bonded to handle wafer 1410 by, for example, fusion bonding the substrate of PIC die 1430 to handle wafer 1410. EIC die 1440 may include bonding pads 1442 on the back side (i.e., the substrate) of EIC die 1440, where bonding pads 1442 may be connected to the EICs on EIC die 1440 through TSVs 1450 as described above with respect to, for example, FIG. 7. EIC die 1440 may be electrically connected to PCB 1420 by bonding wires 1450 which may connect solder pads 1422 on PCB 1420 and bonding pads 1442 on the back side of EIC die 1440. PIC die 1430 may also include V-grooves 1432 aligned with the waveguides on PIC die 1130 for aligning optical fibers with the waveguides.

Package 1400 may also include a top cooling plate 1470 that includes one or more mesa structures 1472 formed thereon. Top cooling plate 1470 may be similar to top cooling plate 1270, and may be bonded to one or more EIC dies 1440 through mesa structures 1472. In some embodiments, the surface of mesa structures 1472 may be coated with one or more metal layers 1474 (e.g., including 3-D printed gold or gold alloy, titanium, or nickel) or an epoxy layer to improve the thermal conductivity at the interface between the substrate of EIC dies 1440 and mesa structures 1472. In some embodiments, the area on the substrate of EIC die 1440 that may contact a mesa structure 1472 may also be coated with a metal layer or an epoxy before bonding with mesa structure 1472. In some embodiments, a cooling device (e.g., a cold head) may be attached to the top cooling plate to take heat away from EIC die 1440.

In some embodiments, one or more die stacks may be bonded on a cooling plate (e.g., a handle wafer or a metal plate) through the substrates of the EIC dies, rather than the substrates of the PIC dies. For example, the EIC/PIC die stacks may be bonded on top of a handle wafer by fusion bonding the substrates of the EIC dies to the handle wafer. The EIC/PIC die stacks may also be bonded on top of mesa structures formed on the handle wafer or the cooling plate, for example, using gold plating layers or other metal layers coated on the mesa structures and/or the substrates of the EIC dies. In this way, the heat generated by the EICs may be dissipated through the cooling plate without going through the more thermally sensitive PICS.

Figure 15:
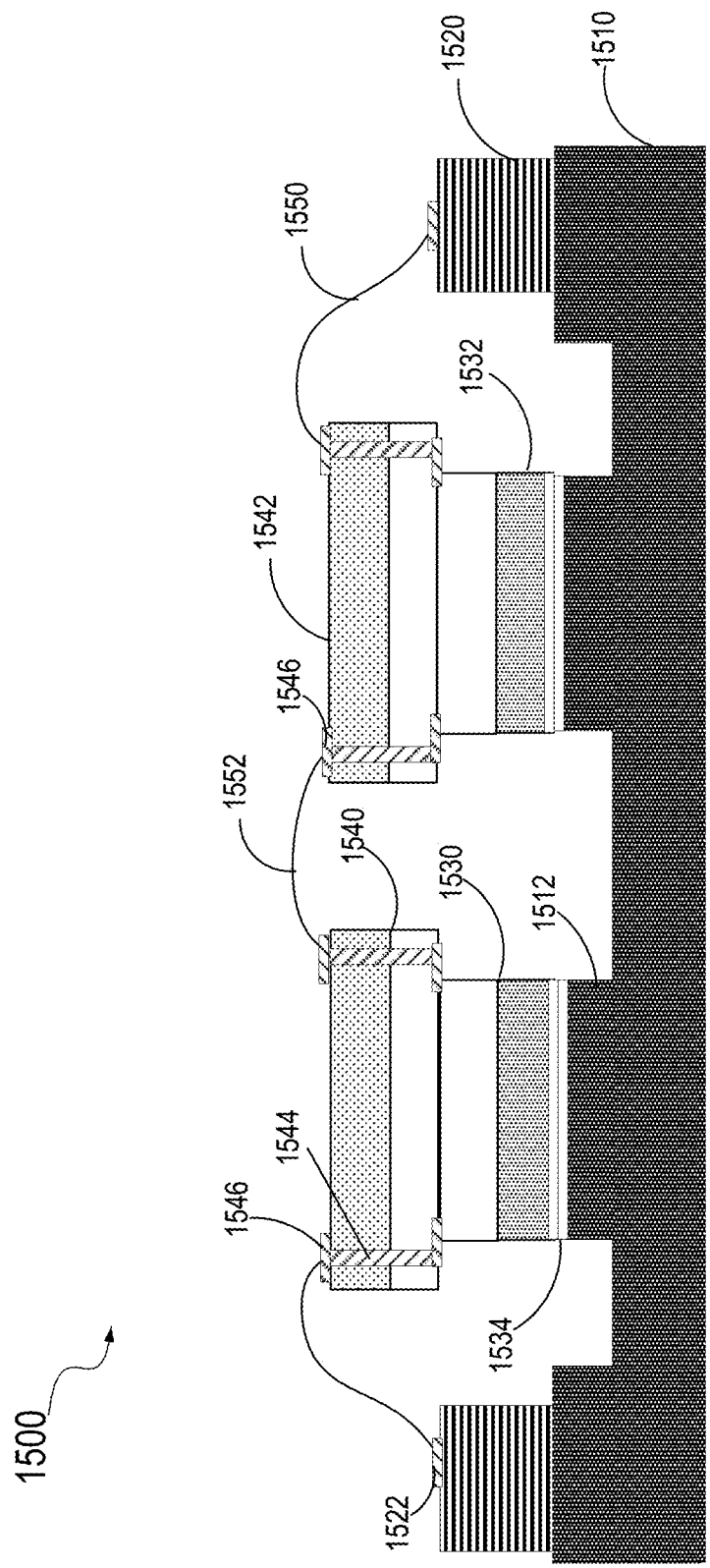
FIG. 15 is a cross-sectional view of an example of a package including multiple die stacks according to certain embodiments.

FIG. 15 is a cross-sectional view of an example of a package 1500 including multiple PIC/EIC die stacks bonded on a cooling plate 1510 according to certain embodiments. As described above, cooling plate 1510 may include a silicon handle wafer or a metal plate. In some embodiments, mesa structures 1512 may be formed on cooling plate 1510, for example, by dry or wet etching or micro-machining. Each PIC/EIC die stack may include an EIC die 1530 and a PIC die 1540 bonded face-to-face as described above (e.g., through fusion bonding or hybrid bonding) such that the length of the interconnects between the PICS and EICs can be minimized. Substrates 1532 of EIC dies 1530 may be bonded to cooling plate 1510 (e.g., mesa structures 1512 on cooling plate 1510) using an epoxy or through fusion bonding or hybrid bonding. For example, a metal layer 1534 (e.g., gold or other metal or metal alloy) or an epoxy layer may be formed on the top surfaces of mesa structures 1512 and/or substrates 1532 of EIC dies 1530 for bonding the die stacks to cooling plate 1510 and for improving the thermal conductivity at the interface. A cooling device (e.g., a cold head) may be attached to cooling plate 1510 to take away the thermal energy generated by the EICs through cooling plate 1510.

PCBs 1520 may also be bonded on cooling plate 1510, such as mesa structures 1512 of cooling plate 1510, using an epoxy or through fusion bonding or hybrid bonding. As described above, in some embodiments, PCBs 1520 may include a semiconductor substrate. Electric power and data signals may be delivered to the die stacks through PCBs 1520 and bonding wires 1550, which may be bonded to solder pads 1522 on PCBs 1520 and bonding pads 1546 on substrates 1542 of PIC dies 1540. Bonding pads 1546 on substrates 1542 of PIC dies 1540 may be connected to the photonic integrated circuits and the electronic integrated circuits through TSVs 1544. Different die stacks may be connected together through bonding wires 1552. In some embodiments, a top cooling plate, such as top cooling plate 1270, 1370, or 1470, may be bonded to substrates 1542 of PIC dies 1540.

The methods and processes described above are some example techniques for fabricating hybrid systems that include photonic integrated circuits and electronic integrated circuits in a same package. In other embodiments, different methods, processes, and/or interconnecting devices may be used to integrate photonic integrated circuits and electronic integrated circuits in a same package to achieve the desired functional, mechanical, thermal, and other performance. For example, as described in detail below, the silicon handle wafer with the die stacks bonded thereon may be coupled to a metal studs and a thicker platform wafer (e.g., a thick silicon wafer or metal wafer) to achieve the desired mechanical strength and thermal conductivity.

Figure 16:
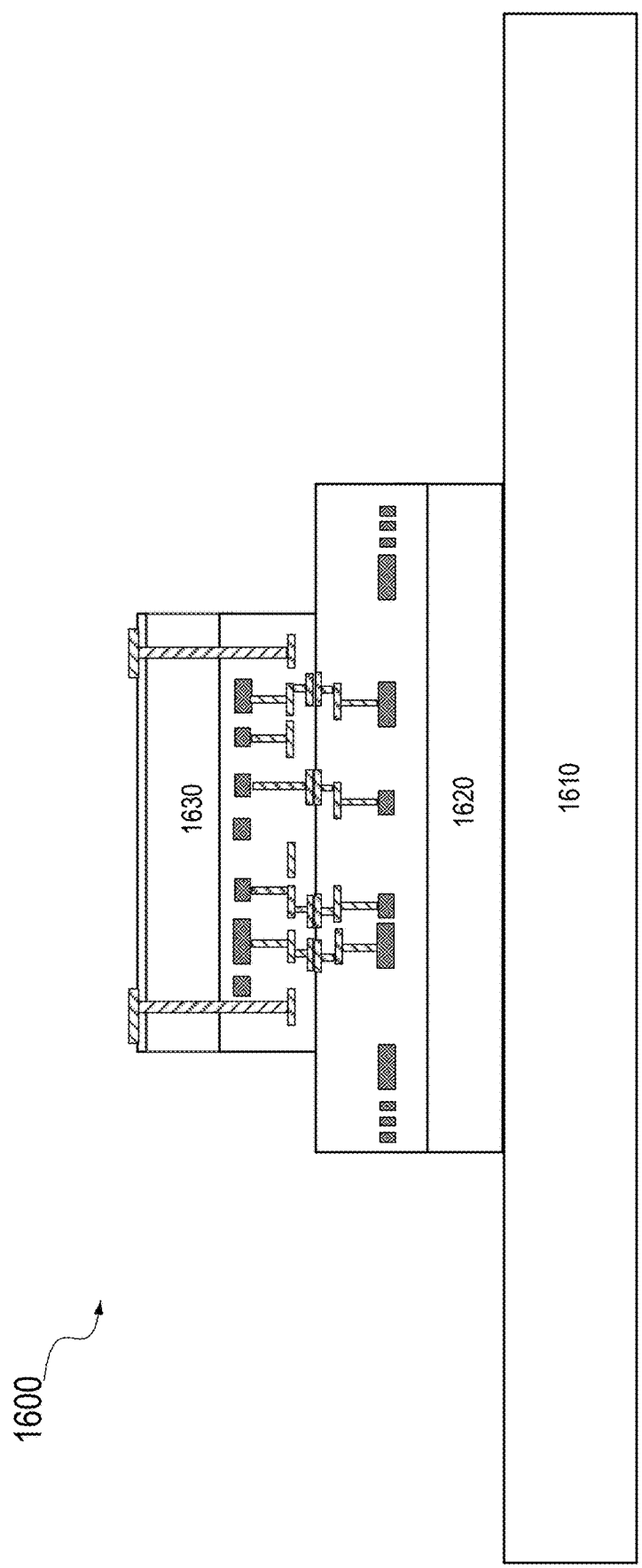
FIG. 16 is a cross-sectional view of an example of a package including a PIC and an EIC on a silicon handle wafer according to certain embodiments.

FIG. 16 is a cross-sectional view of an example of a package 1600 including a PIC 1620 and an EIC 1630 on a silicon handle wafer 1610 according to certain embodiments. Silicon handle wafer 1610 may include a thin silicon substrate with a thickness about, for example, 1 mm. As described above, PIC 1620 may include photonic integrated circuits, such as waveguides, photodetectors, optical couplers, switches, and the like. EIC 1630 may include, for example, controllers, logic circuits, device drivers, through silicon vias, bonding traces and/or pads, and the like. PIC 1620 and EIC 1630 may be bonded to form a die stack as described above with respect to, for example, FIGS. 1-4B. In the example shown in FIG. 16, silicon handle wafer 1610 may be bonded with the backside (i.e., the substrate) of PIC 1620 through, for example, fusion bonding as described above.

Figure 17:
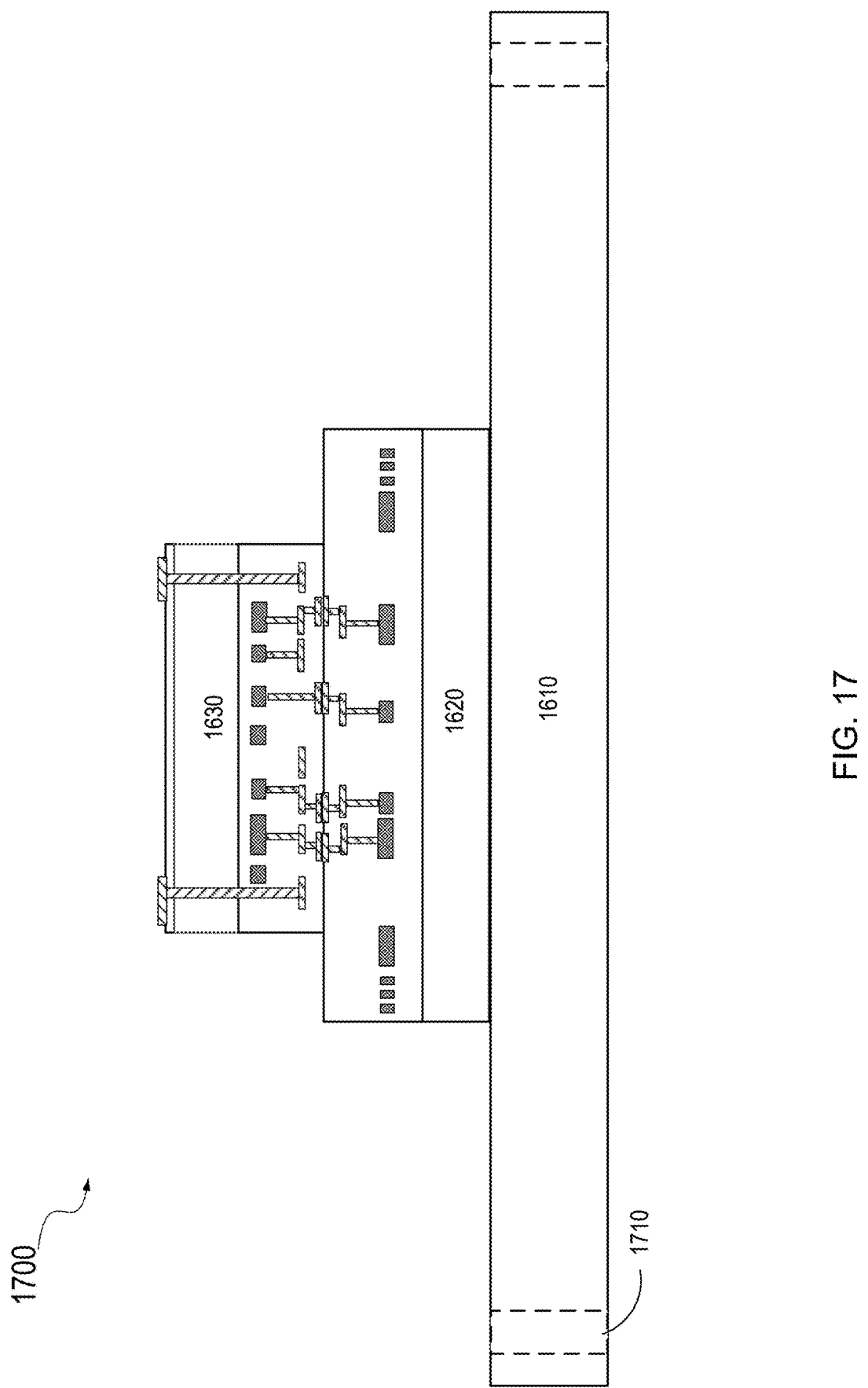
FIG. 17 is a cross-sectional view of an example of a package including a PIC and an EIC on a silicon handle wafer with holes formed thereon according to certain embodiments.

FIG. 17 is a cross-sectional view of an example of a package 1700 including PIC 1620 and EIC 1630 on silicon handle wafer 1610 with holes 1710 formed thereon according to certain embodiments. Package 1700 may be made from package 1600, where holes 1710 may be micromachined (e.g., drilled) or etched in silicon handle wafer 1610 from the top side or bottom side. Holes 1710 may have a diameter less than, equal to, or greater than about 1 mm. Holes 1710 may be formed according to a pattern in silicon handle wafer 1610 at, for example, the edge of silicon handle wafer 1610.

Figure 18:
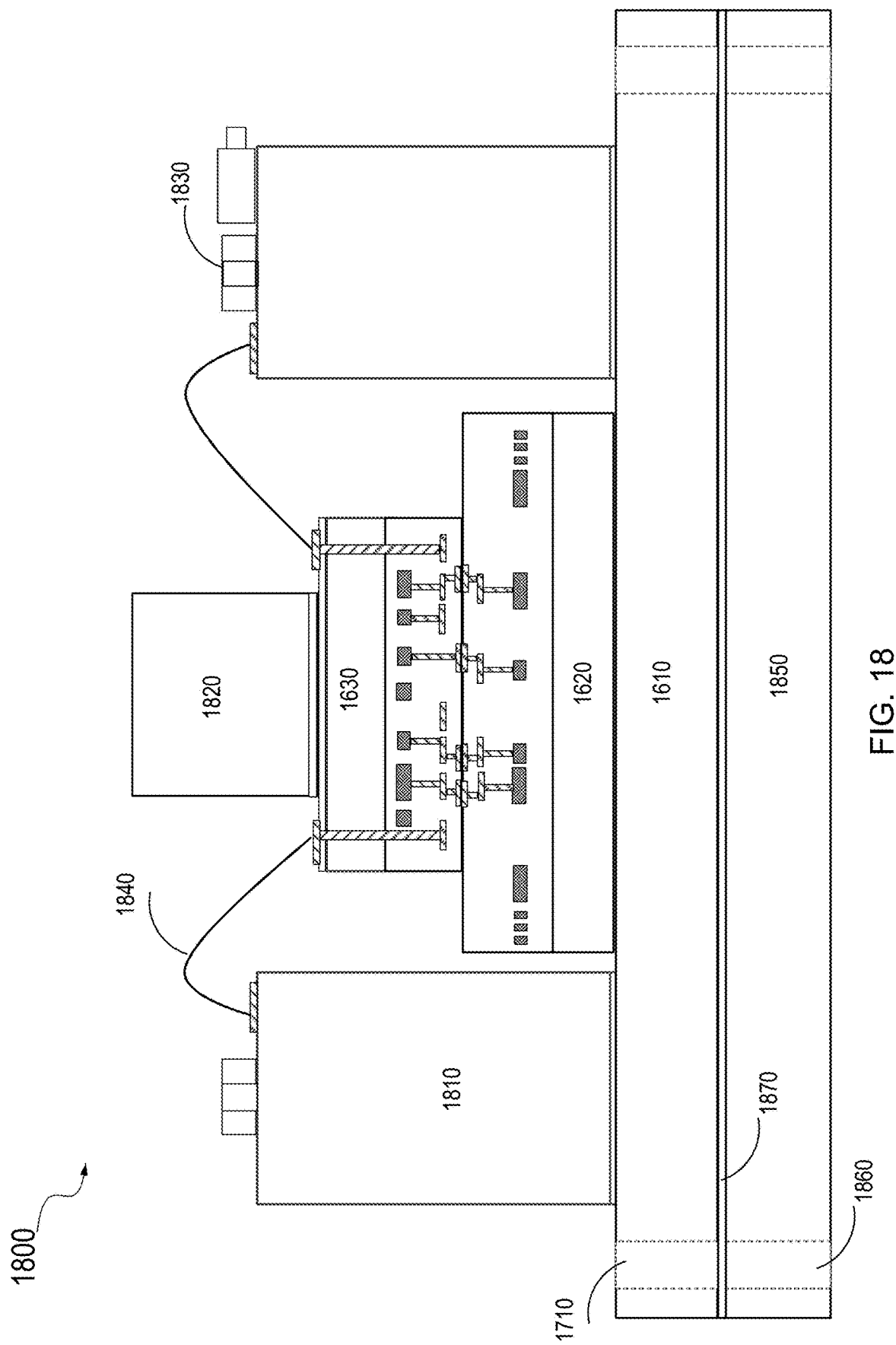
FIG. 18 is a cross-sectional view of an example of a package including a PIC, an EIC, a metal block, and PCBs 1810 on a silicon handle wafer and a platform wafer according to certain embodiments.

FIG. 18 is a cross-sectional view of an example of a package 1800 including PIC 1620, EIC 1630, a metal block 1820, and PCBs 1810 on silicon handle wafer 1610 and a platform wafer 1850 according to certain embodiments. Package 1800 may be made from package 1700. In the example shown in FIG. 18, PCBs 1810 may be bonded to silicon handle wafer 1610, various active or passive components may be installed on PCBs 1810, PCBs 1810 may be wire-bonded to EIC 1630, and a metal block 1820 (e.g., a copper block) may be bonded to EIC 1630.

As described above, PCBs 1810 may include, for example, organic materials, inorganic dielectric materials, or passive or active semiconductor materials, such as passive or active silicon interposers. PCBs 1810 may be bonded to silicon handle wafer 1610 using various techniques. For example, if silicon is used for PCBs 1810, fusion bonding techniques may be used. If oxides, such as silicon dioxide, are used for PCBs 1810, a hybrid bonding technique may be used. If other materials are used for PCBs 1810, an epoxy or an adhesive may be used to attach PCBs 1810 to the silicon handle wafer. Active or passive electrical components, such as power regulators, capacitors, inductors, or other components for power distribution, and connectors, may be installed (e.g., soldered) on PCBs 1810. PCBs 1810 may then be wire-bonded to EIC 1630. For example, metal wires 1840 may be bonded to bonding pads on PCBs 1810 and bonding pads on the back side of EIC 1630.

In some embodiments, metal block 1820, such as a copper block, may be bonded to the back side of EIC 1630. Metal block 1820 may be used as a heat sink for conducting heat from EIC 1630. In some embodiments, the surface of metal block 1820 may be coated with one or more metal layers, such as gold or gold alloy, titanium, or nickel, or an epoxy layer to improve the thermal conductivity at the interface between the substrate of EIC 1630 and metal block 1820.

In some embodiments, platform wafer 1850, which may have better mechanical strength and/or thermal conductivity, may be attached to silicon handle wafer 1610. For example, platform wafer 1850 may include a thick silicon wafer or metal substrate. In one example, platform wafer 1850 may include a silicon wafer with a thickness about 2 cm. In some embodiments, platform wafer 1850 may be attached to silicon handle wafer 1610 using an adhesive layer 1870, which may also improve the thermal conductivity at the interface between platform wafer 1850 and silicon handle wafer 1610. Platform wafer 1850 may include holes 1860 formed thereon. Holes 1860 may be, for example, drilled in platform wafer, and may align with holes 1710 in silicon handle wafer 1610.

Figure 19:
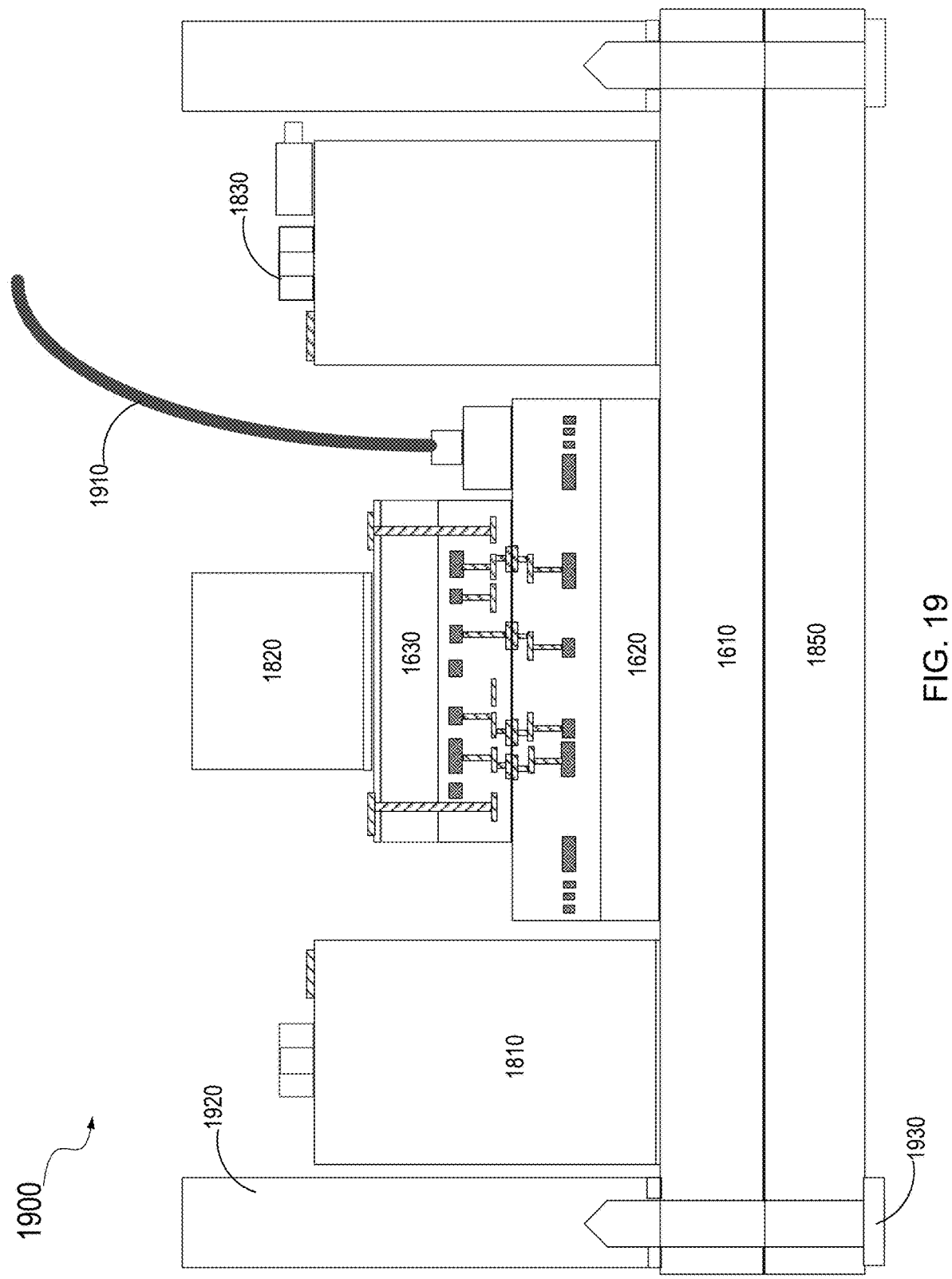
FIG. 19 is a cross-sectional view of an example of a package including a silicon handle wafer and a platform silicon wafer coupled to metal studs through fasteners according to certain embodiments.

FIG. 19 is a cross-sectional view of an example of a package 1900 including silicon handle wafer 1610 and platform wafer 1850 coupled to metal studs 1920 through fasteners 1930 according to certain embodiments. The view angle of the cross-sectional view shown in FIG. 19 may be orthogonal to the view angle of the cross-sectional view shown in FIG. 18. In the illustrated example, optical fibers 1910 may be bonded to PIC 1620, for example, through a gradient index lens, a micro-lens, and/or a coupler (e.g., a grating, a prism, a tapering waveguide, etc.).

Metal studs 1920 (e.g., copper studs) may be attached to silicon handle wafer 1610. Metal studs 1920 may include drilled holes with threads formed therein, and may align with holes 1710 in silicon handle wafer 1610 and holes 1860 in platform wafer 1850. Metal studs 1920, silicon handle wafer 1610, and platform wafer 1850 may be securely coupled together by fasteners 1930, such as screws. Metal studs 1920 and platform wafer 1850 may help to improve the mechanical strength of the packaged device and the thermal conductivity from silicon handle wafer 1610 to a heat sink.

Figure 20:
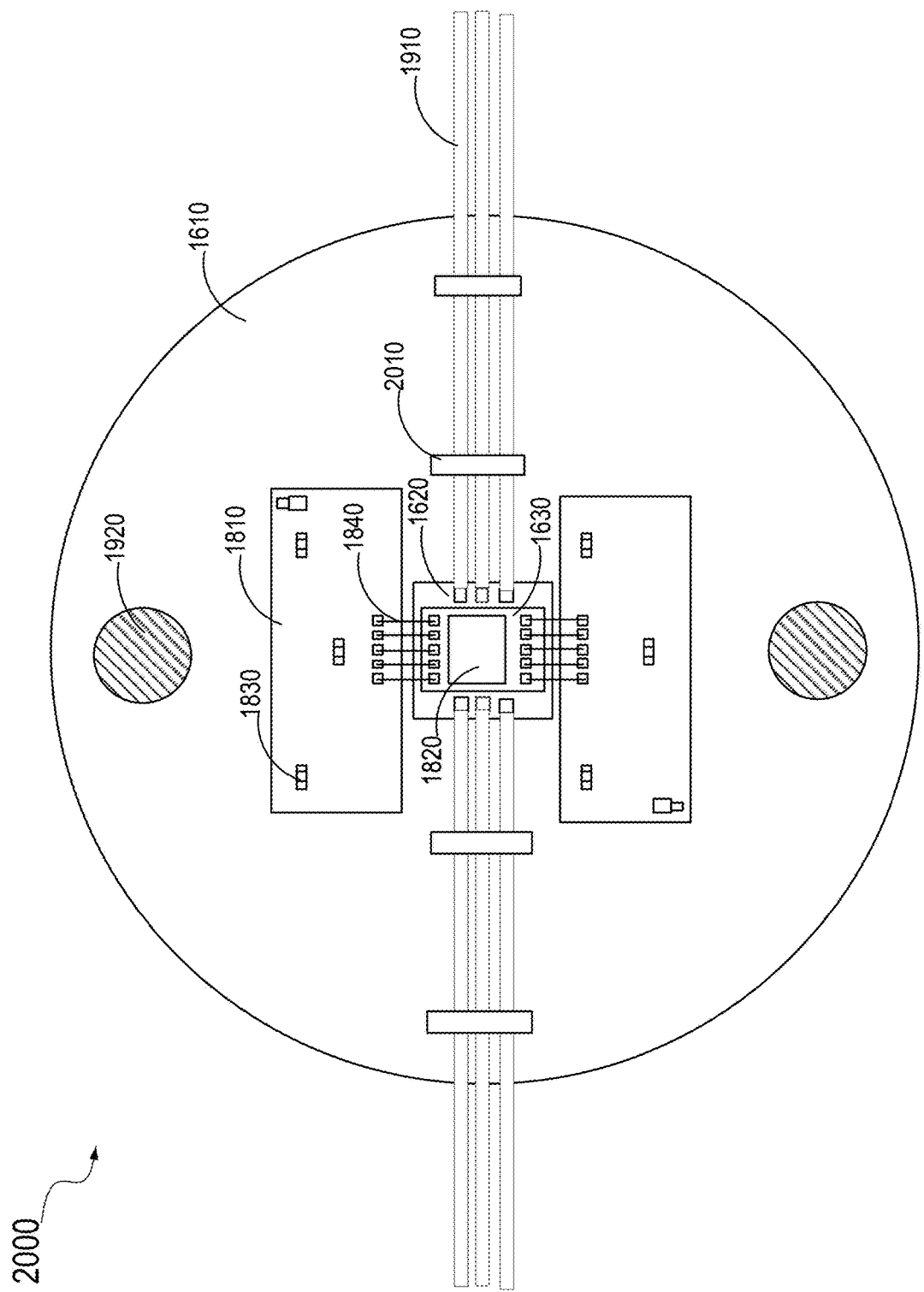
FIG. 20 is a top view of an example of a package including a silicon handle wafer and a platform silicon wafer coupled to metal studs through fasteners according to certain embodiments.

FIG. 20 is a top view of the example of package 1900 including silicon handle wafer 1610 and platform wafer 1850 coupled to metal studs 1920 according to certain embodiments. In the illustrated example, PCBs 1810 may be on two opposite sides of the die stack that may include PIC 1620 and EIC 1630, where metal block 1820 may be bonded on top of EIC 1630. PCBs 1810 may include electrical components 1830 installed thereon, and may be connected to EIC 1630 through metal wires 1840. Optical fibers 1910 may be routed on the other two opposite sides of the die stack and coupled to PIC 1620. Optical fibers 1910 may be secured to silicon handle wafer 1610 or other PCBs bonded on silicon handle wafer 1610 using harnesses 2010. FIG. 20 also shows metal studs 1920 that are positioned on silicon handle wafer 1610 and secured to silicon handle wafer 1610 using, for example, fasteners 1930 (not shown in FIG. 20).

Even though FIG. 20 only shows two PCBs 1810 and two metal studs 1920, it is noted that one or more PCBs 1810 may be bonded to silicon handle wafer 1610 and three or more metal studs 1920 may be used in a packaged hybrid system. The one or more PCBs 1810 may be arranged at any suitable locations on silicon handle wafer 1610. The three or more metal studs 1920 may also be positioned at any suitable locations on silicon handle wafer 1610. In addition, as described above with respect to, for example, FIG. 15, one or more die stacks may be bonded on silicon handle wafer 1610.

Techniques disclosed herein can be used to assemble photonic integrated circuits and electronic integrated circuits for an optical quantum computer, where at least some of the photonic integrated circuits (e.g., single photon detectors) and/or electronic integrated circuits may work best at low temperatures, such as cryogenic temperatures (e.g., below about 5 K), in order to achieve the desired performance (e.g., sensitivity).

Figure 21:
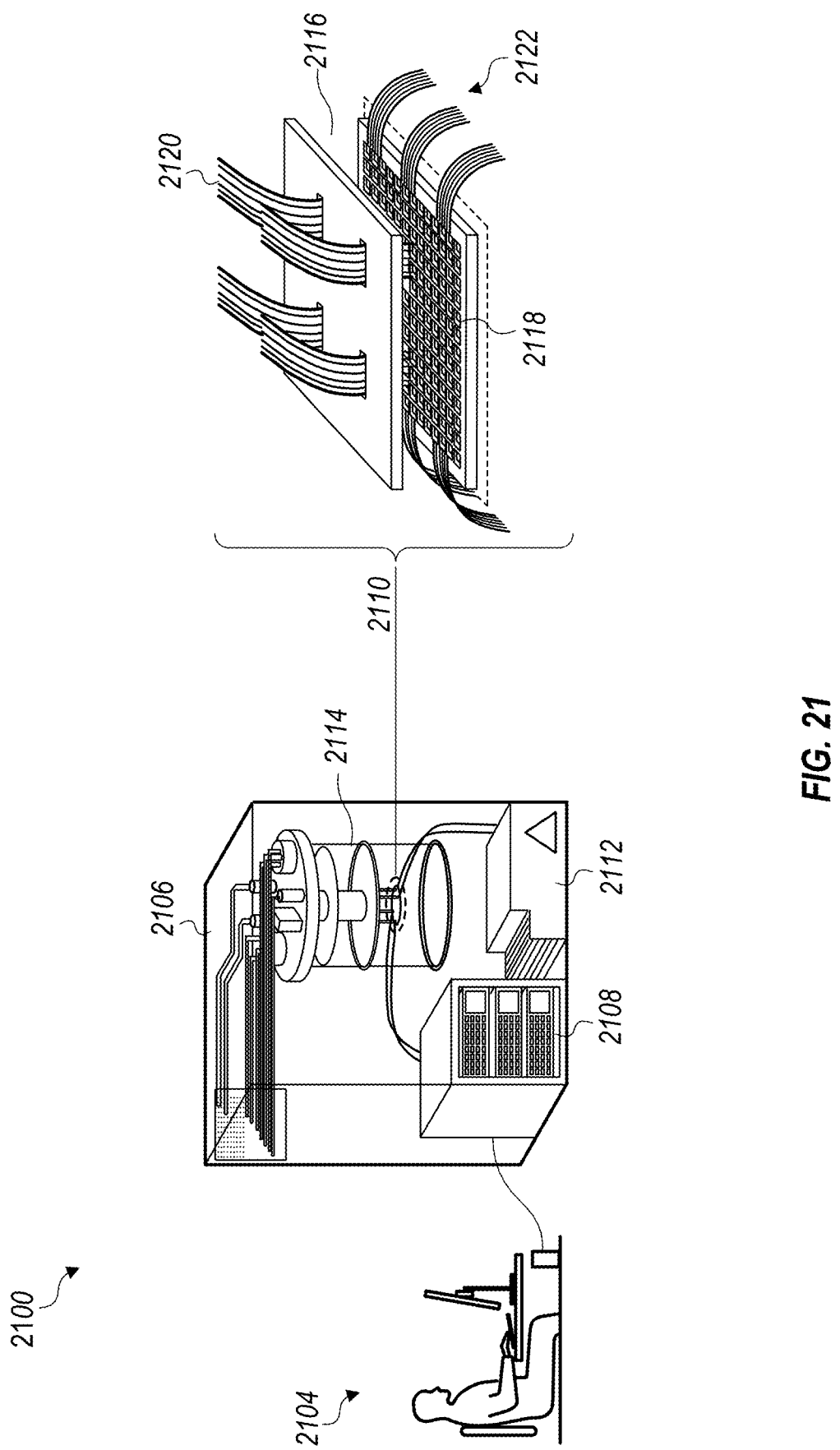
FIG. 21 is a simplified system block diagram of an example of a hybrid quantum computing system including electro-optic devices according to certain embodiments.

FIG. 21 is a simplified system block diagram of an example of a hybrid QC system 2100 including electro-optic devices (e.g., switches) according to certain embodiments. In order to operate at low temperatures, for example liquid helium temperatures, embodiments of the present invention integrate the electro-optic switches discussed herein into a system that includes cooling systems. Thus, embodiments of the present invention provide a hybrid computing system, for example, as illustrated in FIG. 21. The hybrid quantum computing (QC) system 2100 includes a user interface device 2104 that is communicatively coupled to a hybrid quantum computing subsystem 2106. The user interface device 2104 can be any type of user interface device, e.g., a terminal including a display, keyboard, mouse, touchscreen and the like. In addition, the user interface device can itself be a computer such as a personal computer (PC), laptop, tablet computer and the like. In some embodiments, the user interface device 2104 provides an interface with which a user can interact with the hybrid QC subsystem 2106. For example, the user interface device 2104 may run software, such as a text editor, an interactive development environment (IDE), command prompt, graphical user interface, and the like so that the user can program, or otherwise interact with, the QC subsystem to run one or more quantum algorithms. In other embodiments, the hybrid QC subsystem 2106 may be pre-programmed and the user interface device 2104 may simply be an interface where a user can initiate a quantum computation, monitor the progress, and receive results from the hybrid QC subsystem 2106. Hybrid QC subsystem 2106 further includes a classical computing system 2108 coupled to one or more quantum computing chips 2110. In some examples, the classical computing system 2108 and the quantum computing chip 2110 can be coupled to other electronic components 2112, e.g., pulsed pump lasers, microwave oscillators, power supplies, networking hardware, etc.

In some embodiments that utilize cryogenic operation, the quantum computing system 2109 can be housed within a cryostat, e.g., cryostat 2114. In some embodiments, the quantum computing chip 2110 can include one or more constituent chips, e.g., hybrid electronic chip 2116 and integrated photonics chip 2118, which may include various waveguide structures and/or EO devices disclosed herein. Signals can be routed on- and off-chip any number of ways, e.g., via optical interconnects 2120 and via other electronic interconnects 2122. In addition, the hybrid quantum computing system 2100 may employ a quantum computing process, e.g., measurement-based quantum computing (MBQC) that employs one or more cluster states of qubits.

It will be apparent to those skilled in the art that substantial variations may be made in accordance with specific implementations. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The terms "machine-readable medium" and "computer-readable medium" as used herein refer to any storage medium that participates in providing data that causes a machine to operate in a specific fashion. In embodiments provided hereinabove, various machine-readable media might be involved in providing instructions/code to processors and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media, punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms "and," "or," and "and/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A device comprising:
a photonic integrated circuit (PIC) die including a photonic integrated circuit formed at a first surface of the PIC die; and
an electronic integrated circuit (EIC) die including an electronic integrated circuit formed at a bottom surface of the EIC die, wherein the EIC die includes a through silicon via (TSV) extending from the bottom surface of the EIC die to a top surface of the EIC die;
wherein the first surface of the PIC die is bonded to the bottom surface of the EIC die.

2. The device of claim 1 wherein the TSV electrically couples a contact at the top surface of the EIC die to the photonic integrated circuit.

3. The device of claim 2 further comprising a silicon handle wafer and wherein the PIC die is bonded to the silicon handle wafer.

4. The device of claim 3 further comprising a circuit board assembly attached to the silicon handle wafer and electrically coupled to the contact.

5. The device of claim 1 wherein the PIC die includes a quantum computing circuit.

6. The device of claim 1 wherein the photonic integrated circuit comprises a single photon detector.

7. The device of claim 1 wherein the photonic integrated circuit comprises a photon detector coupled to a logic circuit within the EIC.

8. The device of claim 1 wherein the first surface of the PIC die is fusion bonded to the bottom surface of the EIC die.

9. The device of claim 8 wherein the first surface of the PIC die is fusion bonded to the bottom surface of the EIC die in a wafer bonding process.

10. The device of claim 1 wherein the first surface of the PIC die is hybrid bonded to the bottom surface of the EIC die.

11. A device comprising:
a first silicon die including a quantum computing circuit element formed proximate a first surface of the first silicon die; and
a second silicon die including an electronic logic circuit formed proximate a bottom surface of the second silicon die, wherein the second silicon die includes a through silicon via electrically coupled between the electronic logic circuit and a contact on a second surface of the second silicon die;
wherein the first surface of the first silicon die is bonded to the bottom surface of the second silicon die.

12. The device of claim 11 wherein the second silicon die includes a redistribution layer formed at the second surface and the contact is at an outer surface of the redistribution layer.

13. The device of claim 11 wherein the first surface of the first silicon die is fusion bonded to the bottom surface of the second silicon die.

14. The device of claim 11 wherein the first surface of the first silicon die is hybrid bonded to the bottom surface of the second silicon die.

15. The device of claim 11 wherein the quantum computing circuit element comprises a single photon detector.

16. The device of claim 11 wherein the quantum computing circuit element is coupled to the electronic logic circuit.

17. The device of claim 11 further comprising a silicon handle wafer attached to the first silicon die.

18. The device of claim 17 further comprising a circuit board assembly attached to the silicon handle wafer and electrically coupled to the electronic logic circuit through a through silicon via formed through the second silicon die.

* * * * *